US008946861B2

(12) United States Patent
Camillo-Castillo et al.

(10) Patent No.: US 8,946,861 B2
(45) Date of Patent: Feb. 3, 2015

(54) BIPOLAR DEVICE HAVING A MONOCRYSTALLINE SEMICONDUCTOR INTRINSIC BASE TO EXTRINSIC BASE LINK-UP REGION

(71) Applicant: International Business Machines Corporation, Armonk, NY (US)

(72) Inventors: Renata A. Camillo-Castillo, Essex Junction, VT (US); Vibhor Jain, Essex Junction, VT (US); Vikas K. Kaushal, Essex Junction, VT (US); Marwan H. Khater, Astoria, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/914,707

(22) Filed: Jun. 11, 2013

(65) Prior Publication Data

US 2014/0361300 A1   Dec. 11, 2014

(51) Int. Cl.
| | |
|---|---|
| *H01L 27/082* | (2006.01) |
| *H01L 27/102* | (2006.01) |
| *H01L 29/70* | (2006.01) |
| *H01L 31/11* | (2006.01) |
| *H01L 29/739* | (2006.01) |
| *H01L 31/075* | (2012.01) |
| *H01L 31/105* | (2006.01) |
| *H01L 31/117* | (2006.01) |
| *H01L 29/10* | (2006.01) |

(Continued)

(52) U.S. Cl.
CPC ...... *H01L 29/1004* (2013.01); *H01L 29/66242* (2013.01); *H01L 29/737* (2013.01)
USPC .......... 257/565; 257/197; 257/E29.044; 257/E29.187; 257/E29.188; 257/E29.197

(58) Field of Classification Search
USPC ............... 257/197, 565, E29.044, E29.187, 257/E29.188, E29.197
See application file for complete search history.

(56) References Cited

U.S. PATENT DOCUMENTS

| | | | |
|---|---|---|---|
| 4,523,370 | A | 6/1985 | Sullivan et al. |
| 4,849,371 | A | 7/1989 | Hansen et al. |

(Continued)

OTHER PUBLICATIONS

U.S. Appl. No. 13/782,094, Office Action Communication dated Mar. 18, 2014, 7 pages.

(Continued)

*Primary Examiner* — Ida M Soward
(74) *Attorney, Agent, or Firm* — Gibb & Riley, LLC; Anthony J. Canale

(57) ABSTRACT

Disclosed are bipolar devices, which incorporate an entirely monocrystalline link-up region between the intrinsic and extrinsic base layers, and methods of forming the devices. In the methods, a selective epitaxial deposition process grows monocrystalline semiconductor material for the extrinsic base layer on an exposed edge portion of a monocrystalline section of an intrinsic base layer. This deposition process is continued to intentionally overgrow the monocrystalline semiconductor material until it grows laterally and essentially covers a dielectric landing pad on a center portion of that same monocrystalline section of the intrinsic base layer. Subsequently, an opening is formed through the extrinsic base layer to the dielectric landing pad and the dielectric landing pad is selectively removed, thereby exposing monocrystalline surfaces only of the intrinsic and extrinsic base layers. A semiconductor layer is then formed by epitaxial deposition on the exposed monocrystalline surfaces, thereby forming the entirely monocrystalline link-up region.

12 Claims, 13 Drawing Sheets

(51) Int. Cl.
*H01L 29/66* (2006.01)
*H01L 29/737* (2006.01)

(56) References Cited

U.S. PATENT DOCUMENTS

| | | | |
|---|---|---|---|
| 4,981,806 A | 1/1991 | Maas et al. | |
| 5,008,207 A * | 4/1991 | Blouse et al. | 438/312 |
| 5,213,988 A | 5/1993 | Yamauchi et al. | |
| 5,272,095 A | 12/1993 | Enquist et al. | |
| 5,286,996 A * | 2/1994 | Neudeck et al. | 257/586 |
| 5,516,710 A | 5/1996 | Boyd et al. | |
| 5,629,556 A | 5/1997 | Johnson | |
| 5,654,211 A | 8/1997 | Ham | |
| 5,668,396 A | 9/1997 | Sato | |
| 5,994,196 A * | 11/1999 | Seog | 438/370 |
| 6,156,594 A * | 12/2000 | Gris | 438/202 |
| 6,239,477 B1 | 5/2001 | Johnson | |
| 6,521,974 B1 * | 2/2003 | Oda et al. | 257/593 |
| 6,541,336 B1 | 4/2003 | Cantell et al. | |
| 6,680,522 B1 * | 1/2004 | Sato | 257/588 |
| 6,686,250 B1 * | 2/2004 | Kalnitsky et al. | 438/345 |
| 6,777,302 B1 | 8/2004 | Chen et al. | |
| 6,927,476 B2 | 8/2005 | Freeman et al. | |
| 6,972,443 B2 | 12/2005 | Khater | |
| 7,022,578 B2 | 4/2006 | Verma et al. | |
| 7,037,798 B2 | 5/2006 | Adam et al. | |
| 7,045,876 B2 | 5/2006 | An et al. | |
| 7,049,240 B2 | 5/2006 | Fan et al. | |
| 7,265,018 B2 * | 9/2007 | Dunn et al. | 438/312 |
| 7,521,772 B2 | 4/2009 | Adam et al. | |
| 7,777,255 B2 * | 8/2010 | Rucker et al. | 257/197 |
| 7,932,155 B2 | 4/2011 | Dunn et al. | |
| 7,932,541 B2 | 4/2011 | Joseph et al. | |
| 8,664,698 B2 * | 3/2014 | John et al. | 257/197 |
| 8,786,051 B2 * | 7/2014 | Adkisson et al. | 257/588 |
| 8,810,005 B1 * | 8/2014 | Camillo-Castillo et al. | 257/592 |
| 2003/0098465 A1 * | 5/2003 | Suzumura et al. | 257/197 |
| 2004/0222497 A1 * | 11/2004 | Dunn et al. | 257/578 |
| 2007/0045664 A1 * | 3/2007 | Miura et al. | 257/197 |
| 2008/0121930 A1 * | 5/2008 | Adam et al. | 257/190 |
| 2008/0121937 A1 | 5/2008 | Adam et al. | |
| 2008/0265282 A1 | 10/2008 | Gluschenkov et al. | |
| 2009/0020851 A1 | 1/2009 | Liu et al. | |
| 2009/0179228 A1 | 7/2009 | Joseph et al. | |
| 2009/0321880 A1 * | 12/2009 | Aoki | 257/591 |
| 2010/0019326 A1 | 1/2010 | Knoll et al. | |
| 2011/0312147 A1 | 12/2011 | Harame et al. | |
| 2013/0270649 A1 * | 10/2013 | Chantre et al. | 257/378 |
| 2014/0175520 A1 * | 6/2014 | Fu et al. | 257/197 |

OTHER PUBLICATIONS

U.S. Appl. No. 13/782,094, Notice of Allowance dated Apr. 14, 2014, 10 pages.
Becker, et al., "Evolution of Residual Stress and Its Relation to Microstructure in Multicrystalline Silicon Thin Film Solar Cells on Glass Prepared by Combined Laser Crystallization and Solid Phase Epitaxy," 24th European Photovoltaic Solar Energy Conference, Sep. 21-25, 2009, Hamburg, Germany, pp. 2494-2499.
U.S. Appl. No. 13/155,730, filed Jun. 8, 2011, Cantell, et al.
U.S. Appl. No. 13/296,496, filed Nov. 15, 2011, Adkisson, et al.
U.S. Appl. No. 13/307,412, filed Nov. 30, 2011, Adkisson, et al.

* cited by examiner

BIPOLAR DEVICE HAVING A MONOCRYSTALLINE SEMICONDUCTOR INTRINSIC BASE TO EXTRINSIC BASE LINK-UP REGION

BACKGROUND

The embodiments disclosed herein relate to bipolar devices (e.g., bipolar junction transistors (BJTs) and heterojunction bipolar transistors (HBTs)) and, more particularly, to bipolar devices incorporating an entirely monocrystalline link-up region between the intrinsic and extrinsic base layers and to methods of forming such bipolar devices.

As discussed in U.S. Pat. No. 6,972,443 issued on Dec. 6, 2005 to Khater, assigned to International Business Machines Corporation and incorporated herein by reference, it is desirable in bipolar devices, such as bipolar junction transistors (BJTs) and, particularly, in high performance heterojunction bipolar transistors (HBTs), to have a relatively high transit frequency $f_T$ and maximum oscillation frequency $f_{max}$. $f_{max}$ is a function of $f_T$ and parasitic resistances and capacitances. One such parasitic resistance is the base resistance $R_b$. Reduction of this base resistance $R_b$ can result in a higher $f_{max}$. Thus, it would be advantageous to provide a bipolar device, such as a bipolar junction transistor (BJT) or heterojunction bipolar transistor (HBT), with reduced base resistance $R_b$ and a method for forming such bipolar device.

SUMMARY

In view of the foregoing, disclosed herein are bipolar devices, such as bipolar junction transistors (BJTs) or heterojunction bipolar transistors (HBTs), which incorporate a link-up region that is entirely monocrystalline in structure and that electrically connects an intrinsic base layer to an extrinsic base layer for a reduction in overall base resistance $R_b$ for a higher $f_{max}$. Also disclosed herein are methods of forming these bipolar devices. In the methods, an extrinsic base layer can be formed above an intrinsic base layer by at least initially using a selective epitaxial deposition process. Specifically, a selective epitaxial deposition process can grow monocrystalline semiconductor material for the extrinsic base layer directly on an exposed edge portion of a monocrystalline section of the intrinsic base layer. This selective epitaxial deposition process can further be performed to intentionally overgrow the monocrystalline semiconductor material until it essentially covers a dielectric landing pad on a center portion of that same monocrystalline section of the intrinsic base layer. Depending upon the embodiment, formation of the extrinsic base layer can be completed by this selective epitaxial deposition process alone, by a subsequent non-selective epitaxial deposition process or by a conventional polycrystalline semiconductor deposition process. Subsequently, an opening can be formed through the extrinsic base layer to the dielectric landing pad and the dielectric landing pad can be selectively removed, thereby exposing monocrystalline surfaces only of the intrinsic and extrinsic base layers. Then, a semiconductor layer can be formed by epitaxial deposition on the exposed monocrystalline surfaces, thereby forming a link-up region between the intrinsic and extrinsic base layers that is entirely monocrystalline in structure.

More particularly, a bipolar device disclosed herein can comprise a semiconductor substrate, a collector region within the semiconductor substrate, and an intrinsic base layer on the semiconductor substrate. The intrinsic base layer can comprise a monocrystalline intrinsic base section and a polycrystalline intrinsic base section. The monocrystalline intrinsic base section can be above the collector region and can have a first center portion and a first edge portion positioned laterally adjacent to the first center portion. The polycrystalline intrinsic base section can be positioned laterally immediately adjacent to the first edge portion of the monocrystalline intrinsic base section.

The bipolar device can further comprise a dielectric layer positioned on the polycrystalline intrinsic base section and a semiconductor layer positioned on the first center portion of the monocrystalline intrinsic base section. The semiconductor layer can be entirely monocrystalline in structure and can have a second center portion, a second edge portion positioned laterally adjacent to the second center portion and a vertical extension offset from the second edge portion and extending upward.

The bipolar device can further comprise an extrinsic base layer. This extrinsic base layer can comprise a polycrystalline extrinsic base section on the dielectric layer above the polycrystalline intrinsic base section. This extrinsic base layer can further comprise a monocrystalline extrinsic base section on the first edge portion of the monocrystalline intrinsic base section in a space between the dielectric layer and the second edge portion of the semiconductor layer. This monocrystalline extrinsic base section can also extend laterally in one direction over (i.e., onto the top surface of) the dielectric layer to the polycrystalline extrinsic base section. Thus, the interface within the extrinsic base layer between the monocrystalline extrinsic base section and polycrystalline extrinsic base section is above the dielectric layer. The monocrystalline extrinsic base section can further extend laterally in the opposite direction over (i.e., onto the top surface of) the second edge portion of the semiconductor layer to the vertical extension of that semiconductor layer.

In such a bipolar device, since the semiconductor layer is entirely monocrystalline in structure, the second edge portion and the vertical extension thereof effectively create an entirely monocrystalline link-up region between the monocrystalline intrinsic base section of the intrinsic base layer and monocrystalline extrinsic base section of the extrinsic base layer. Such a monocrystalline link-up region provides a reduction in overall base resistance $R_b$ within the bipolar device and, thereby a higher $f_{max}$.

Another bipolar device disclosed herein can, similarly, comprise a semiconductor substrate, a collector region within the semiconductor substrate, and an intrinsic base layer on the semiconductor substrate. The intrinsic base layer can comprise a monocrystalline intrinsic base section and a polycrystalline intrinsic base section. The monocrystalline intrinsic base section can be above the collector region and can have a first center portion and a first edge portion positioned laterally adjacent to the first center portion. The polycrystalline intrinsic base section can be positioned laterally immediately adjacent to the first edge portion of the monocrystalline intrinsic base section.

The bipolar device can further comprise a semiconductor layer. The semiconductor layer can be entirely monocrystalline in structure and can be positioned on the first center portion of the monocrystalline intrinsic base section. This semiconductor layer can have a second center portion, a second edge portion positioned laterally adjacent to the second center portion and a vertical extension offset from the second edge portion.

The bipolar device can further comprise an extrinsic base layer. The extrinsic base layer can comprise a polycrystalline extrinsic base section on the polycrystalline intrinsic base section. This extrinsic base layer can further comprise a monocrystalline extrinsic base section on the first edge portion of the monocrystalline intrinsic base section positioned laterally immediately adjacent to the second edge portion of the semiconductor layer. This monocrystalline extrinsic base section can also extend laterally in one direction beyond the first interface in the intrinsic base layer between the monocrystalline intrinsic base section and the polycrystalline intrinsic base section (i.e., onto the top surface of the polycrystalline intrinsic base section). Thus, the second interface within the extrinsic base layer between the monocrystalline extrinsic base section and polycrystalline extrinsic base section is above the polycrystalline intrinsic base section offset from the first interface in the intrinsic base layer between the monocrystalline intrinsic base section and the polycrystalline intrinsic base section. The monocrystalline extrinsic base section can further extend laterally in the opposite direction over (i.e., onto the top surface of) the second edge portion of the semiconductor layer to the vertical extension of that semiconductor layer.

As with the previously described bipolar device, since the semiconductor layer is entirely monocrystalline in structure, the second edge portion and the vertical extension effectively create an entirely monocrystalline link-up region between the monocrystalline intrinsic base section of the intrinsic base layer and monocrystalline extrinsic base section of the extrinsic base layer. Such a monocrystalline link-up region provides a reduction in overall base resistance $R_b$ within the bipolar device and, thereby a higher $f_{max}$.

Also disclosed are methods of forming such bipolar devices. The methods can comprise providing a semiconductor substrate and forming a collector region within the semiconductor substrate.

Next, an intrinsic base layer can be formed on the semiconductor substrate such that it comprises a monocrystalline intrinsic base section and a polycrystalline intrinsic base section. The monocrystalline intrinsic base section can be above the collector region and can have a first center portion and a first edge portion positioned laterally adjacent to the first center portion. The polycrystalline intrinsic base section can be positioned laterally immediately adjacent to the first edge portion of the monocrystalline intrinsic base section.

Then, a dielectric layer can be formed on the intrinsic base layer and an opening can be formed in the dielectric layer. This opening can be formed so as to at least expose the first edge portion of the monocrystalline intrinsic base section and, thereby create a dielectric landing pad on the first center portion of the monocrystalline intrinsic base section and. Depending upon which of the bipolar devices described above is being formed, the size of the opening will vary. Specifically, the opening can be formed so that it is aligned above and exposes only the first edge portion of the monocrystalline intrinsic base section, thereby leaving a dielectric landing pad on the first center portion of the monocrystalline intrinsic base section and an additional portion of the dielectric layer on the polycrystalline intrinsic base section. Alternatively, the opening can be formed so that it is aligned above and exposes the first edge portion of the monocrystalline intrinsic base section and also the polycrystalline intrinsic base section such that the only portion of the dielectric layer remaining on the intrinsic base layer is a dielectric landing bad on the first center portion of the monocrystalline intrinsic base section.

After the opening in the dielectric layer is formed, an extrinsic base layer can be formed using one or more deposition processes such that this extrinsic base layer comprises a monocrystalline extrinsic base section and polycrystalline extrinsic base section position laterally adjacent to the monocrystalline extrinsic base section. The deposition process(es) can vary depending upon whether the additional portion of the dielectric layer remains on the polycrystalline intrinsic base section or not. However, in either case, a selective epitaxial deposition process is at least initially performed. That is, monocrystalline semiconductor material for the monocrystalline extrinsic base section of the extrinsic base layer will initially be grown from the exposed first edge portion of the monocrystalline intrinsic base section using a selective epitaxial deposition process. This selective epitaxial deposition process will be performed to intentionally overgrow the monocrystalline semiconductor material until it extends laterally onto and essentially covers the dielectric landing pad.

Specifically, when the opening is aligned above and exposes only the first edge portion of the monocrystalline intrinsic base section of the intrinsic base layer such that a dielectric landing pad remains on the first center portion of the monocrystalline intrinsic base section and an additional portion of the dielectric layer remains on the polycrystalline intrinsic base section, the extrinsic base layer can be formed by initially performing a selective epitaxial deposition process to grow monocrystalline semiconductor material for the monocrystalline extrinsic base section of the extrinsic base layer on the exposed first edge portion of the monocrystalline intrinsic base section. This selective epitaxial deposition process can be continued as the monocrystalline semiconductor material grows laterally in one direction over the remaining portion of the dielectric layer above the polycrystalline intrinsic base section and in the opposite direction over the dielectric landing pad. This selective epitaxial deposition process can further be continued until the monocrystalline semiconductor material for the monocrystalline extrinsic base section essentially covers the dielectric landing pad. Once the dielectric landing pad is essentially covered with monocrystalline semiconductor material (i.e., once the monocrystalline extrinsic base section of the extrinsic base layer is completely formed), either a non-selective epitaxial deposition process can be performed or conventional polycrystalline semiconductor deposition processes can be performed in order to form the polycrystalline extrinsic base section on the dielectric layer positioned laterally adjacent to the monocrystalline extrinsic base section. Thus, in this case, the interface within the extrinsic base layer between the monocrystalline extrinsic base section and the polycrystalline extrinsic base section will be above the additional portion of the dielectric layer.

Alternatively, when the opening is aligned above and exposes the first edge portion of the monocrystalline intrinsic base section as well as the polycrystalline intrinsic base section such that only a dielectric landing pad remains the intrinsic base layer and, particularly, on the first center portion of the monocrystalline intrinsic base section, the extrinsic base layer can be formed by performing a single epitaxial deposition process and, particularly, a selective epitaxial deposition process. This selective epitaxial deposition process can grow monocrystalline semiconductor material for the monocrystalline extrinsic base section on the exposed first edge portion of the monocrystalline intrinsic base section and can essentially simultaneously grow polycrystalline semiconductor material for the polycrystalline extrinsic base section on the exposed polycrystalline intrinsic base section. This selective epitaxial deposition process can be continued as the monocrystalline semiconductor material grows laterally in one direction onto the polycrystalline intrinsic base section (i.e., over the first interface in the intrinsic base layer between the monocrystalline intrinsic base section and the polycrystalline intrinsic base section) and in the opposite direction onto the dielectric landing pad. This selective epitaxial deposition process can be performed until the monocrystalline semiconductor material for the monocrystalline extrinsic base section essentially covers the dielectric landing pad. As a result, in this case, a second interface within the extrinsic base layer between the monocrystalline extrinsic base section and the polycrystalline extrinsic section will be above the polycrystalline intrinsic base section offset from the first interface in the intrinsic base layer between the monocrystalline intrinsic base section and the polycrystalline intrinsic base section.

In any case, after the extrinsic base layer is formed, an additional opening can be formed through the extrinsic base layer to the dielectric landing pad. Then, the dielectric landing pad can be selectively removed, thereby exposing monocrystalline surfaces only of the intrinsic base layer (and, more particularly, of the monocrystalline intrinsic base section) and of the extrinsic base layer (and, more particularly, of the monocrystalline extrinsic base section).

Next, a semiconductor layer can be epitaxially deposited on the exposed monocrystalline surfaces within the additional opening such that the semiconductor layer is entirely monocrystalline in structure. Formed in this manner, the semiconductor layer will have a second center portion aligned above the first center portion of the monocrystalline intrinsic base section. It will further have a second edge portion, which is positioned laterally between the second center portion and a lower sidewall surface of the monocrystalline extrinsic base section and which is further stacked vertically between the top surface of the monocrystalline intrinsic base section and a bottom surface of the monocrystalline extrinsic base section. Finally, it will have a vertical extension, which is offset from the second edge portion (i.e., between the second edge portion and the second center portion), which extends upwards and which is positioned laterally immediately adjacent to an upper sidewall surface of the monocrystalline extrinsic base section.

By forming bipolar devices in this manner, the second edge portion and the vertical extension of the semiconductor layer create an entirely monocrystalline link-up region between the monocrystalline intrinsic base section of the intrinsic base layer and the monocrystalline extrinsic base section of the extrinsic base layer. Such a monocrystalline link-up region provides a reduction in overall base resistance $R_b$ within the bipolar device and, thereby a higher $f_{max}$.

BRIEF DESCRIPTION OF THE DRAWINGS

The embodiments herein will be better understood from the following detailed description with reference to the drawings, which are not necessarily drawn to scale and in which.

DETAILED DESCRIPTION

Figure 1A:
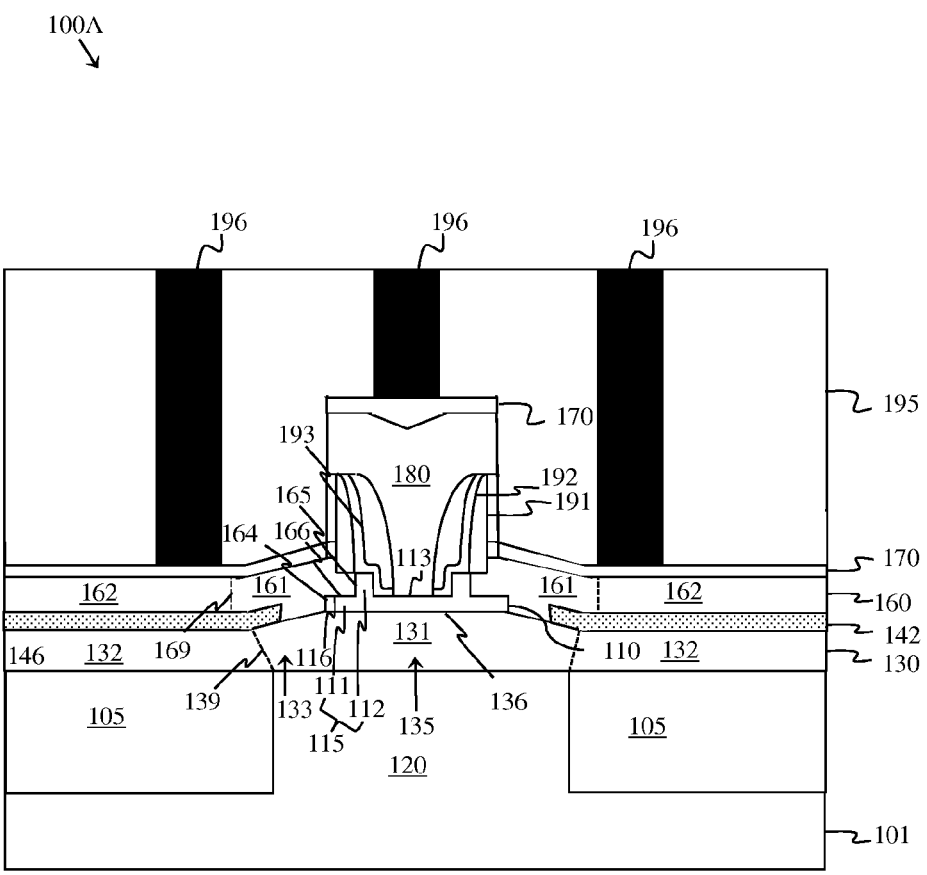
FIG. 1A is a cross-section diagram illustrating a bipolar device.

As mentioned above, it is desirable in bipolar devices, such as bipolar junction transistors (BJTs) and, particularly, in high performance heterojunction bipolar transistors (HBTs), to have a relatively high transit frequency $f_T$ and maximum oscillation frequency $f_{max}$. $f_{max}$ is a function of $f_T$ and parasitic resistances and capacitances. One such parasitic resistance is the base resistance $R_b$.

Current techniques for forming bipolar devices typically result in a structure having a monocrystalline section of an intrinsic base layer electrically connected to a polycrystalline semiconductor extrinsic base layer by a link-up region. The link-up region is typically formed by forming an emitter opening that extends vertically through the extrinsic base layer to a dielectric landing pad, which is wider than the emitter opening and aligned above the monocrystalline section of the intrinsic base layer. The dielectric landing pad is then selectively removed, thereby exposing a horizontal surface of the monocrystalline section of the intrinsic base layer as well a horizontal surface and vertical surfaces of the polycrystalline extrinsic base layer. Next, a semiconductor material is epitaxially deposited on the exposed surfaces of the intrinsic and extrinsic base layers until the cavity created by removal of the dielectric landing pad is filled, thereby forming the link-up region. Since the semiconductor material for the link-up region is epitaxially deposited on surfaces of polycrystalline and monocrystalline semiconductor material, the resulting link-up region comprises a combination of both polycrystalline and monocrystalline semiconductor material. Unfortunately, due to the random nature of polycrystalline semiconductor growth in terms of grain size and orientation, this epitaxial deposition process inevitable results in a non-uniform interface between the polycrystalline and monocrystalline semiconductor material within the link-up region as well as the creation of voids at that non-uniform interface. In such a structure, relatively high overall base resistance $R_b$ is the result of high sheet resistance of the polycrystalline semiconductor material in the extrinsic base and adjacent portion of the link-up region as well as the presence of voids within the link-up region.

In view of the foregoing, disclosed herein are bipolar devices, such as bipolar junction transistors (BJTs) or heterojunction bipolar transistors (HBTs), which incorporate a link-up region that is entirely monocrystalline in structure and that electrically connects an intrinsic base layer to an extrinsic base layer for a reduction in overall base resistance $R_b$ for a higher $f_{max}$. Also disclosed herein are methods of forming these bipolar devices. In the methods, an extrinsic base layer can be formed above an intrinsic base layer by initially using a selective epitaxial deposition process. Specifically, a selective epitaxial deposition process can grow monocrystalline semiconductor material for the extrinsic base layer directly on an exposed edge portion of a monocrystalline section of the intrinsic base layer. This selective epitaxial deposition process can performed to intentionally overgrow the monocrystalline semiconductor material until it essentially covers a dielectric landing pad on a center portion of that same monocrystalline section of the intrinsic base layer. Depending upon the embodiment, formation of the extrinsic base layer can be completed by this selective epitaxial deposition process alone, by a subsequent non-selective epitaxial deposition process or by a conventional polycrystalline semiconductor deposition process. Subsequently, an opening can be formed through the extrinsic base layer to the dielectric landing pad and the dielectric landing pad can be selectively removed, thereby exposing monocrystalline surfaces only of the intrinsic and extrinsic base layers. Then, a semiconductor layer can be formed by epitaxial deposition on the exposed monocrystalline surfaces of the intrinsic and extrinsic base layers, thereby forming a link-up region between the intrinsic and extrinsic base layers that is entirely monocrystalline in structure.

Figure 1B:
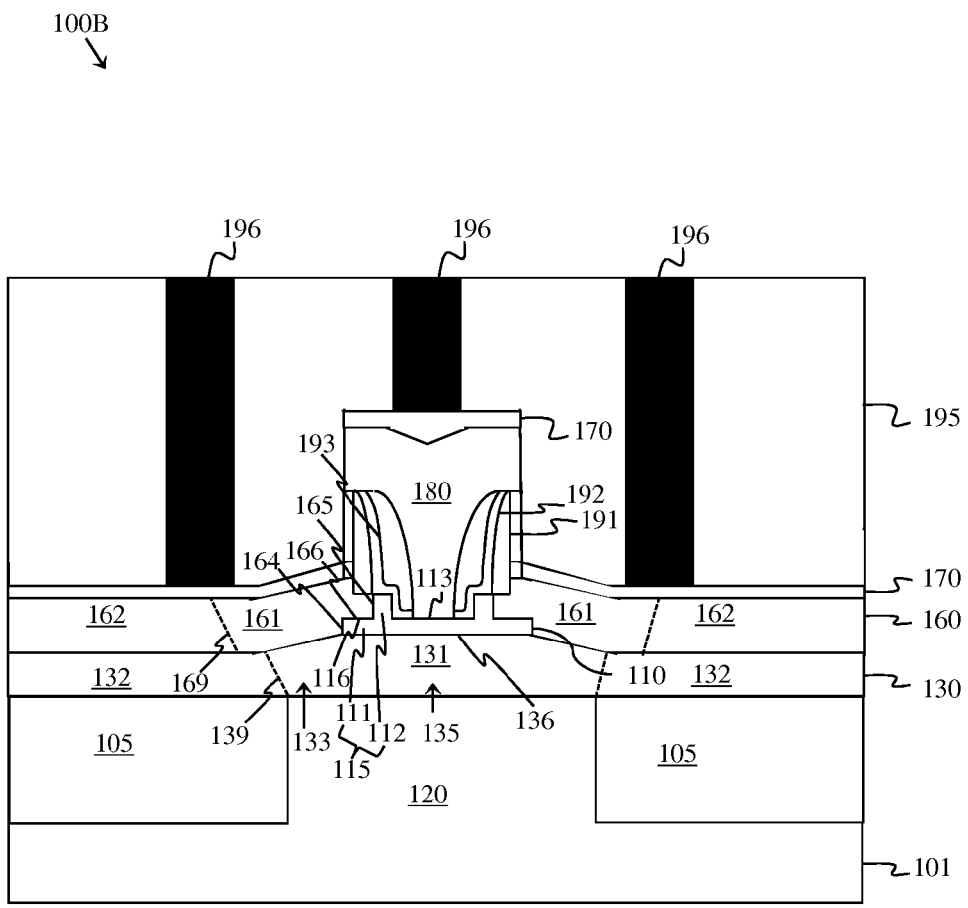
FIG. 1B is a cross-section diagram illustrating another bipolar device.

More particularly, referring to FIGS. 1A and 1B, disclosed herein are bipolar devices 100A and 100B, respectively. These bipolar devices 100A-B can be, for example, bipolar junction transistors (BJTs) or heterojunction bipolar transistors (HBTs). The bipolar devices 100A-B can each comprise at least an intrinsic base layer 130, an extrinsic base layer 160 and a semiconductor layer 110 comprising an entirely monocrystalline link-up region 115 (see portions 111 and 112) that electrically connects monocrystalline sections 131, 161 of the intrinsic base layer 130 and the extrinsic base layer 160, respectively.

Figure 2:
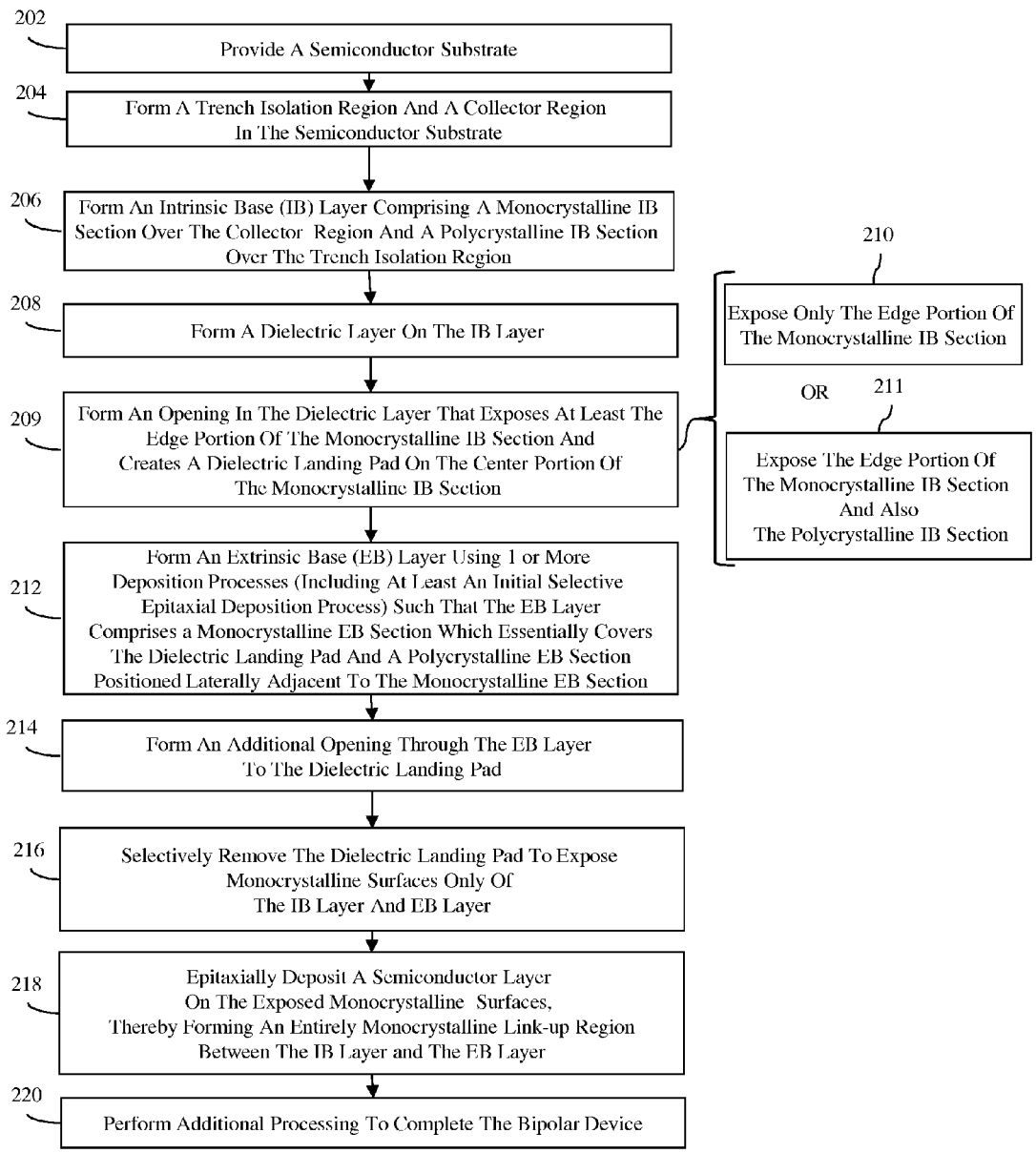
FIG. 2 is a flow diagram illustrating methods of forming the bipolar devices of FIGS. 1A and 1B.

Specifically, the bipolar devices 100A-B can each comprise a semiconductor substrate 101. The semiconductor substrate 101 can comprise a monocrystalline semiconductor material. For example, the semiconductor substrate 101 can comprise a bulk silicon substrate or any other suitable bulk monocrystalline semiconductor substrate, as illustrated in FIGS. 1 and 2. Alternatively, the semiconductor substrate 101 can comprise a monocrystalline semiconductor layer of a semiconductor-on-insulator (SW) wafer (e.g., a silicon layer of a silicon-on-insulator (SOI) wafer) (not shown). The semiconductor substrate 101 can have a first type conductivity (e.g., a P-type conductivity). Thus, for example, the semiconductor substrate 101 can comprise a P-silicon substrate (i.e., a silicon substrate having a relatively low concentration of a P-type dopant).

A trench isolation region 105 can be within and at the top surface of the semiconductor substrate 101. This trench isolation region 105 can comprise, for example, a conventional shallow trench isolation (STI) region comprising a relatively shallow trench filled with one or more isolation materials (e.g., silicon oxide ($SiO_x$), silicon nitride ($SiN_x$), silicon oxynitride ($SiO_xN_y$) or any other suitable isolation material or combination thereof).

A collector region 120 can also be within and at the top surface of the substrate 101 such that it is positioned laterally adjacent to the trench isolation region 105. Specifically, this collector region 120 can comprise a doped region that is within the semiconductor substrate 101 and that has a second type conductivity that is different from the first type conductivity (e.g., an N-type conductivity). This collector region 120 can comprise, for example, a single N-well region. Alternatively, this collector region 120 can comprise multiple N-type collector components, having different doping concentrations and, thereby different conductivity levels. Such collector regions are well known in the art and, thus, the details are omitted from this specification in order to allow the reader to focus on the salient aspects of the disclosed bipolar device structures. In any case, the STI region 105 can border (i.e., laterally surround) and, thereby define the dimensions (e.g., the length and the width) of the collector region 120.

The bipolar devices 100A-B can each further comprise an intrinsic base layer 130. This intrinsic base layer 130 can comprise an epitaxially deposited semiconductor material. For example, in the case of a BJT, this intrinsic base layer 130 can comprise epitaxial silicon; whereas, in the case of an HBT, this intrinsic base layer 130 can comprise epitaxial silicon germanium, silicon carbide, or silicon germanium carbide. This intrinsic base layer 130 can be positioned on and, particularly, above and immediately adjacent to (i.e., in contact with) the top surface of the semiconductor substrate 101 at the collector region 120 and can further extend laterally onto the trench isolation region 105. The intrinsic base layer 130 can, optionally, have a relatively thin un-doped lower portion that it has neither N-type, nor P-type conductivity and further may have a relatively thin upper portion that is doped with a specific concentration of a first type conductivity dopant (e.g., a P-type dopant) such that it has the same type conductivity as the semiconductor substrate 101 (e.g., P-type conductivity).

This intrinsic base layer 130 can be formed, as discussed in greater detail below with regard to the methods, using a non-selective epitaxial deposition process such that it comprises a monocrystalline intrinsic base section 131, which is above the monocrystalline semiconductor material of the semiconductor substrate 101 at the collector region 120, and a polycrystalline intrinsic base section 132, which is above the trench isolation region 105. Thus, the interface 139 within the intrinsic base layer 130 between the monocrystalline intrinsic base section 131 and the polycrystalline intrinsic base section 132 can be aligned with interface between the trench isolation region 105 and the collector region 120. The monocrystalline intrinsic base section 131 can have a first center portion 135 and a first edge portion 133 positioned laterally adjacent to the first center portion 135. The polycrystalline intrinsic base section 132 can be positioned laterally immediately adjacent to the first edge portion 133 of the monocrystalline intrinsic base section 131. Those skilled in the art will recognize that, when a non-selective epitaxial deposition process is used to form the intrinsic base layer 130, the resulting monocrystalline intrinsic base section 131 will typically grow faster and, thereby be thicker than the polycrystalline intrinsic base section 132.

The bipolar devices 100A-B can each further comprise an extrinsic base layer 160 and a semiconductor layer 110. The extrinsic base layer 160 can comprise a monocrystalline extrinsic base section 161 and a polycrystalline extrinsic base section 162. The semiconductor layer 110 can comprise an entirely monocrystalline link-up region 115 (see portions 111 and 112) that electrically connects the monocrystalline intrinsic base section 131 of the intrinsic base layer 130 to the monocrystalline extrinsic base section 161 of the extrinsic base layer 160. The bipolar devices 100A-B differ in that the bipolar device 100A of FIG. 1A includes dielectric layer(s) 142 that physically separate the polycrystalline intrinsic base section 132 from the polycrystalline extrinsic base section 162 and the bipolar device 100B of FIG. 1B is devoid of such dielectric layer(s) 142.

More specifically, referring to FIG. 1A, the bipolar device 100A can further comprise at least one dielectric layer 142. The dielectric layer(s) 142 can be positioned on and, particularly, above and immediately adjacent to the top surface 136 of the intrinsic base layer 130 at the polycrystalline intrinsic base section 132. The dielectric layer(s) 142 can comprise, for example, a silicon oxide ($SiO_x$) layer, a silicon nitride ($SiN_x$) layer, a silicon oxynitride ($SiO_xN_y$) layer or any other suitable dielectric layer or stack of such dielectric layers. Optionally, the dielectric layer(s) 142 can extend laterally onto, without covering, the first edge portion 133 of the monocrystalline intrinsic base section 131 (i.e., it can extend laterally beyond the first interface within the intrinsic base layer 130 between the polycrystalline intrinsic base section 132 and the monocrystalline intrinsic base section 131). Alternatively, referring to FIG. 1B, the bipolar device 100B can be similar to the bipolar device 100A, but can be devoid of the dielectric layer(s) 142.

In any case, the bipolar devices 100A-B can each comprise a semiconductor layer 110. This semiconductor layer 110 can be positioned on and, particularly, above and immediately adjacent to the top surface 136 of the intrinsic base layer 130 at the first center portion 135 of the monocrystalline intrinsic base section 131. The semiconductor layer 110 can further have a second center portion 113, a second edge portion 111, and a vertical extension 112. The second center portion 113 can be centered on the first center portion 135 of the monocrystalline intrinsic base section 131. The second edge portion 111 can be positioned laterally adjacent to the second center portion 113 without further extending laterally over the first edge portion 133 of the monocrystalline intrinsic base section 131. The vertical extension 112 can be offset from the second edge portion 111 (e.g., positioned laterally between the second center portion 113 and the second edge portion 111 and extending upward). The semiconductor layer 110 can be entirely monocrystalline in structure such that each of these portions 111, 112 and 113 are entirely monocrystalline in structure. The semiconductor layer 110 can comprise an epitaxially deposited semiconductor material. For example, in the case of either a BJT or HBT, this semiconductor layer 110 can comprise epitaxial silicon, silicon germanium, silicon carbide or silicon germanium carbide. This semiconductor layer 110 may be un-doped such that it has neither N-type, nor P-type conductivity. Alternatively, it may be doped with a first type conductivity dopant (e.g., a P-type dopant) such that it has the same type conductivity as the substrate 101 (e.g., P-type conductivity) and, if applicable, the intrinsic base layer 130.

The bipolar devices 100A-B can also each further comprise an extrinsic base layer 160. This extrinsic base layer 160 can comprise an epitaxially deposited semiconductor material and can have a monocrystalline extrinsic base section 161 and a polycrystalline extrinsic base section 162 positioned laterally adjacent to the monocrystalline extrinsic base section 161.

Specifically, referring to FIG. 1A, in the bipolar device 100A, this extrinsic base layer 160 can be formed, as greater detail below with regard to the methods, using a combination of selective and non-selective epitaxial deposition processes. As a result, the polycrystalline extrinsic base section 162 can be positioned on and, particularly, above and immediately adjacent to the top surface of the dielectric layer(s) 142. Additionally, the monocrystalline extrinsic base section 161 can be positioned on and, particularly, above and immediately adjacent to the top surface 136 of the intrinsic base layer 130 at the first edge portion 133 of the monocrystalline intrinsic base section 131. The monocrystalline extrinsic base section 161 can also extend laterally in one direction onto the top surface of the dielectric layer(s) 142 such that the interface 169 within the extrinsic base layer 160 between the monocrystalline extrinsic base section 161 and the polycrystalline extrinsic base section 162 is above the dielectric layer(s) 142. This monocrystalline extrinsic base section 161 can further extend laterally in the opposite direction onto the top surface of the second edge portion 111 of the semiconductor layer 110 to the vertical extension 112.

Alternatively, referring to FIG. 1B, this extrinsic base layer 160 can be formed, as discussed in greater detail below with regard to the methods, using a single selective epitaxial deposition process. As a result, the polycrystalline extrinsic base section 162 can be positioned on and, particularly, above and immediately adjacent to the polycrystalline intrinsic base section 132 of the intrinsic base layer 130. That is, since the bipolar device 100B is devoid of the dielectric layer(s) 142, the polycrystalline extrinsic base section 162 can be positioned on and, particularly, above and immediately adjacent to the top surface 136 of the intrinsic base layer 130 at the polycrystalline intrinsic base section 132. Additionally, the monocrystalline extrinsic base section 161 can be positioned on and, particularly, above and immediately adjacent to the top surface 136 of the intrinsic base layer 130 at the first edge portion 133 of the monocrystalline intrinsic base section 131. The monocrystalline extrinsic base section 161 can also extend laterally in one direction onto the polycrystalline intrinsic base section 132 (i.e., it can extend laterally beyond the first interface within the intrinsic base layer 130 between the monocrystalline intrinsic base section 131 and the polycrystalline intrinsic base section 132) such that a second interface 169 within the extrinsic base layer 160 between the monocrystalline extrinsic base section 161 and the polycrystalline extrinsic base section 162 is positioned above the polycrystalline intrinsic base section 132. The monocrystalline extrinsic base section 161 can further extend laterally in the opposite direction onto the top surface of the second edge portion 111 of the semiconductor layer 110 to the vertical extension 112 (see detailed discussion below).

In the case of either a BJT or an HBT, the extrinsic base layer 160 of the bipolar device 100A or 100B can comprise epitaxial silicon, silicon germanium, silicon carbide, silicon germanium carbide or a combination of these materials. This extrinsic base layer 160 can be doped with a first type conductivity dopant (e.g., a P-type dopant) such that it has the first type conductivity (e.g., P-type conductivity). Furthermore, the concentration of the first type conductivity dopant (e.g., the P-type dopant) can, optionally, be relatively high as compared to the concentration of the same type conductivity dopant in the intrinsic base layer 130 and/or the semiconductor substrate 101.

As mentioned above, in each of the bipolar devices 100A-B, the monocrystalline extrinsic base section 161 of the extrinsic base layer 160 can be positioned on and, particularly, immediately adjacent to the top surface 136 of the intrinsic base layer 130 at the first edge portion 133 of the monocrystalline intrinsic base section 131 and can further extend laterally onto the top surface of the semiconductor layer 110. More particularly, the monocrystalline extrinsic base section 161 can extend laterally onto the top surface 116 of the second edge portion 111 of the semiconductor layer 110 to the vertical extension 112. Thus, within the semiconductor layer 110, the second edge portion 111 can be positioned laterally immediately adjacent to a lower sidewall surface 164 of the monocrystalline extrinsic base section 161 of the extrinsic base layer 160 and can further be stacked vertically between the top surface 136 of the monocrystalline intrinsic base section 131 of the intrinsic base layer 130 and a bottom surface 166 of the monocrystalline extrinsic base section 161 of the extrinsic base layer 160. Additionally, the vertical extension 112 can be positioned laterally immediately adjacent to an upper sidewall surface 165 of the monocrystalline extrinsic base section 161 of the extrinsic base layer 160, which is offset from the lower sidewall surface 164.

As with conventional bipolar junction transistors (BJTs) and conventional heterojunction bipolar transistors (HBTs), the bipolar devices 100A-B disclosed herein and illustrated in FIGS. 1A-B, respectively, can further comprise additional features including, but not limited to, the following: an emitter layer 180; dielectric spacers 191-193; metal silicide layer(s) 170; one or more interlayer dielectrics 195; contacts 196; etc. Various different configurations for these additional features are well known in the art and can be incorporated into different embodiments of the bipolar device.

For example, as shown in FIGS. 1A-B, the emitter layer 180 (e.g., an essentially T-shaped emitter layer) can be positioned above the second center portion 113 of the semiconductor layer 110, which in turn is aligned above the first center portion 135 of the monocrystalline intrinsic base section 131 of the intrinsic base layer 130. Specifically, the essentially T-shaped emitter layer 180 can have a relatively narrow section that extends vertically through an emitter opening in the extrinsic base layer 160 to the second center portion 113 of the semiconductor layer 110 and a relatively wide section above the narrow section. The emitter layer 180 can comprise, for example, a polycrystalline semiconductor layer (e.g., a polycrystalline silicon layer) having the same second type conductivity as the collector region 120 (e.g., N-type conductivity).

At least one dielectric spacer (e.g., see dielectric spacers 191-193) can electrically isolate the narrow section of the emitter layer 180 from the extrinsic base layer 160. For example, the emitter opening can have an upper portion that extends vertically into, but not through, the extrinsic base layer 160. A first dielectric spacer 191 (e.g., a silicon nitride (SiN$_x$) spacer) can be positioned laterally adjacent to the sidewall of this upper portion of the emitter opening. A second dielectric spacer 192 (e.g., a conformal silicon oxide (SiO$_x$) spacer) can be positioned laterally adjacent to the first dielectric spacer 191 and can further cover the top surface of the semiconductor layer vertical extension 112 as well as the sidewall of the semiconductor layer vertical extension 112 opposite the upper sidewall surface 165 of the extrinsic base layer 160. Finally, a third dielectric spacer 193 (e.g., another silicon nitride (SiN$_x$) spacer) can be positioned laterally between the second dielectric spacer 192 and the narrow portion of the emitter layer 180.

Metal silicide layer(s) 170 can, optionally, be positioned on the top surface of the extrinsic base layer 160 and the top surface of the emitter layer 180. Such metal silicide layers 170 can comprise silicides of, for example, a refractory or noble metal (e.g., nickel (Ni), cobalt (Co), tungsten (W), chromium (Cr), platinum (Pt), titanium (Ti), molybdenum (Mo), palladium (Pd), etc.) or an alloy thereof. It should be noted that, if applicable, the dielectric spacer(s) 191-193 can also isolate the lower portion of the emitter layer 180 from any metal silicide layer 170 on the extrinsic base layer 160.

One or more additional dielectric layer(s) (i.e., interlayer dielectric(s) 195) can blanket (i.e., cover) the bipolar devices 100A-B, as described above. These interlayer dielectric(s) 195 can comprise, for example, any suitable interlayer dielectric material(s). For example, the interlayer dielectric(s) 195 can comprise any of silicon oxide (SiO$_x$), silicon nitride (SiN$_x$), borophosphosilicate glass (BPSG), etc. Finally, contacts 196 can extend vertically through the dielectric layer(s) 195 in order to contact the extrinsic base layer 160, the emitter layer 180, etc.

In the bipolar devices 100A-B, as described in detail above, since the semiconductor layer 110 is entirely monocrystalline in structure, the second edge portion 111 and the vertical extension 112 effectively create an entirely monocrystalline link-up region 115 between the monocrystalline intrinsic base section 131 of the intrinsic base layer 130 and monocrystalline extrinsic base section 161 of the extrinsic base layer 160. Such a monocrystalline link-up region 115 provides a reduction in overall base resistance $R_b$ within the bipolar devices 100A-B and, thereby a higher $f_{max}$.

Referring to FIG. 2, also disclosed herein are methods of forming the above-described bipolar devices 100A-B of FIGS. 1A-B, respectively. The methods can comprise providing a monocrystalline semiconductor substrate 101 (202) and forming, in the semiconductor substrate 101, a collector region 120 and a trench isolation region 105 positioned laterally adjacent to the collector region 120 (204, see FIG. 3).

Figure 4:
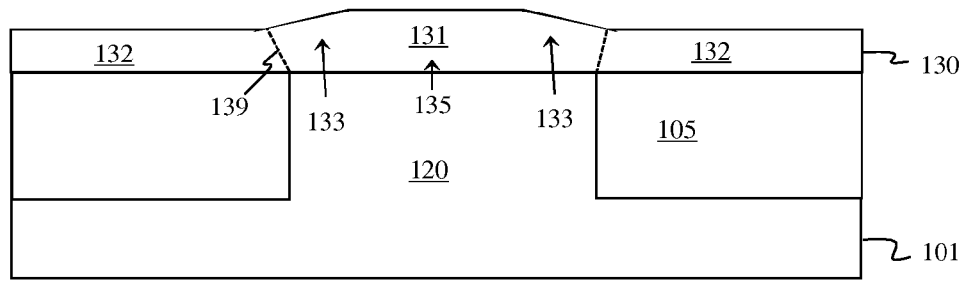
FIG. 4 is a cross-section diagram illustrating a partially completed bipolar device formed according to the flow diagram of FIG. 2.

More particularly, the method embodiments can comprise providing a semiconductor substrate 101 (202). This semiconductor substrate 101 can comprise a monocrystalline semiconductor material. For example, the semiconductor substrate 101 can comprise a bulk silicon substrate or any other suitable bulk semiconductor substrate, as illustrated in FIG. 4. Alternatively, the semiconductor substrate 101 can comprise a monocrystalline semiconductor layer of a semiconductor-on-insulator (SOI) wafer (e.g., a silicon layer of a silicon-on-insulator (SOI) wafer) (not shown). In any case, the semiconductor substrate 101 can have a first type conductivity (e.g., a P-type conductivity). Thus, for example, the semiconductor substrate 101 can comprise a P-silicon substrate (i.e., a silicon substrate having a relatively low concentration of a P-type dopant).

Figure 3:
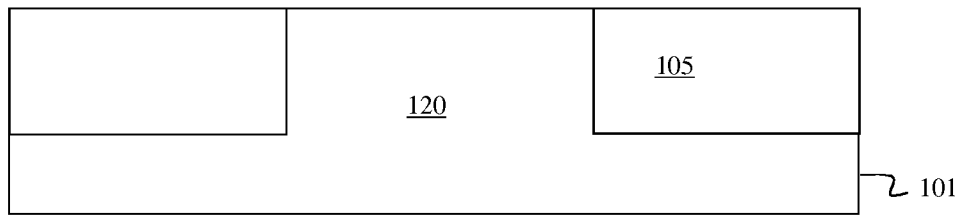
FIG. 3 is a cross-section diagram illustrating a partially completed bipolar device formed according to the flow diagram of FIG. 2.

A trench isolation region 105 can be formed within and at the top surface of the semiconductor substrate 101 so as to define the active area of the bipolar device 100A or 100B (204, see FIG. 3). The trench isolation region 105 can be formed using conventional shallow trench isolation (STI) formation techniques. For example, a trench can be lithographically patterned and etched into the semiconductor substrate 101 so as to define the active region. The trench can then be filled with one or more isolation materials (e.g., silicon oxide ($SiO_x$), silicon nitride ($SiN_x$), silicon oxynitride ($SiO_xN_y$) or any other suitable isolation materials). Additionally, a collector region 120 can be formed within the active area of the semiconductor substrate 101, as defined by the STI region 105 (204, see FIG. 3). Thus, the STI region 105 defines the dimensions (e.g., the length and width) of the collector region 120. This collector region 120 can be formed (e.g., implanted with a dopant) so as to have a second type conductivity that is different from the first type conductivity of the substrate (e.g., an N-type conductivity). Various different techniques for forming BJT and HBT collector regions having different configurations are well known in the art and can be incorporated into the method embodiments disclosed herein. For example, the collector region 120 can be formed as a single N-well region within the semiconductor substrate 101. Alternatively, the collector region 120 can be formed as multiple N-type collector components. Such techniques are well known in the art and, thus, have been omitted from this specification in order to allow the reader to focus on the salient aspects of the disclosed methods.

Next, an intrinsic base layer 130 can be formed (e.g., epitaxially deposited) onto the top surface of the monocrystalline semiconductor substrate 101 such that the intrinsic base layer 130 comprises: a monocrystalline intrinsic base section 131 over the collector region 120 in the semiconductor substrate 101; and a polycrystalline intrinsic base section 132 positioned laterally adjacent to the monocrystalline intrinsic base section 131 and over the trench isolation region 105 (206, see FIG. 4). The monocrystalline intrinsic base section 131 can have a first center portion 135 and a first edge portion 133 positioned laterally between the first center portion 135 and the polycrystalline intrinsic base section 132.

It should be noted that, in the case of a BJT, the intrinsic base layer 130 formed at process 206 can comprise, for example, epitaxial silicon. In the case of an HBT, the intrinsic base layer 130 formed at process 206 can comprise, for example, epitaxial silicon, silicon germanium, silicon carbide, silicon germanium carbide or a combination of two or more of these materials. In any case, this intrinsic base layer 130 can be formed, for example, by performing a non-selective epitaxial deposition process (e.g., a non-selective, ultra high-vacuum-chemical vapor deposition (UHV-CVD), low-temperature epitaxy (LTE) process). Those skilled in the art will recognize that, as a result of such a non-selective epitaxial deposition process, the crystalline structure of the intrinsic base layer 130 will typically mimic that of the material on which the intrinsic base layer is formed. Thus, as mentioned above, the intrinsic base layer 130 will be formed such that it comprises the monocrystalline intrinsic base section 131 and the polycrystalline intrinsic base section 132. The monocrystalline intrinsic base section 131 will be aligned above and approximately equal in size to the collector region 120 within the semiconductor substrate 101, which is monocrystalline in structure. The polycrystalline intrinsic base section 132 will be aligned above the trench isolation region 105 and positioned laterally adjacent to the monocrystalline intrinsic base section 131. Thus, the interface 139 within the intrinsic base layer 130 between the monocrystalline intrinsic base section 131 and the polycrystalline intrinsic base section 132 can be essentially aligned with the interface between the trench isolation region 105 and the collector region 120. Furthermore, the polycrystalline intrinsic base section 132 will typically be less thick than the monocrystalline intrinsic base section 131, as a result of the faster epitaxial growth rate of monocrystalline semiconductor material as compared to polycrystalline semiconductor material.

Finally, deposition of the intrinsic base layer 130 may proceed without any doping to alter conductivity type. Alternatively, the intrinsic base layer 130 may be uniformly in-situ doped with a first conductivity type dopant (e.g., a P-type dopant) so that the resulting intrinsic base layer 130 has the first type conductivity (e.g., P-type conductivity). Alternatively, deposition of the intrinsic base layer 130 may begin without doping such that the resulting intrinsic base layer 130 has a relatively thin un-doped lower portion. Subsequently, in-situ doping with a first conductivity type dopant (e.g., a P-type dopant) can be performed so that the resulting intrinsic base layer 130 has a, relatively thin, doped upper portion with the first type conductivity (e.g., P-type conductivity).

Figure 5:
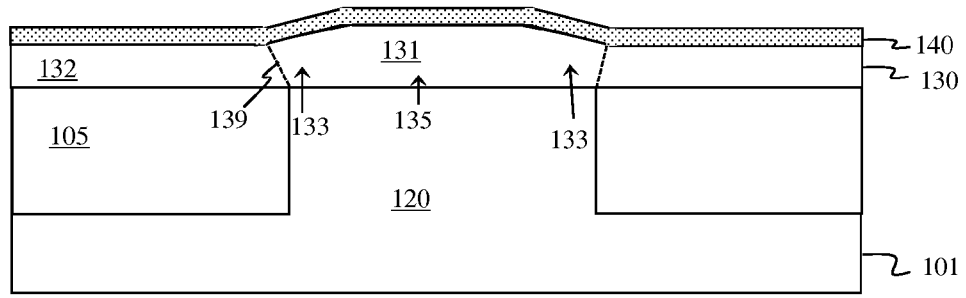
FIG. 5 is a cross-section diagram illustrating a partially completed bipolar device formed according to the flow diagram of FIG. 2.

After the intrinsic base layer 130 is formed at process 206, one or more dielectric layers 140 can be formed (e.g., deposited) on the intrinsic base layer 130 (208, see FIG. 5). The dielectric layer(s) 140 can comprise, for example, a silicon oxide ($SiO_x$) layer, a silicon nitride ($SiN_x$) layer, a silicon oxynitride ($SiO_xN_y$) layer or any other suitable dielectric layer or stack of such dielectric layers. Next, an opening can be formed in the dielectric layer(s) 140 (209). This opening can be formed so as to create a dielectric landing pad 141 on the first center portion 135 of the monocrystalline intrinsic base section 131 of the intrinsic base layer 130 and so as to at least expose the first edge portion 133 of the monocrystalline intrinsic base section 131.

After the opening is formed in the dielectric layer(s)140 at process 209, an extrinsic base layer 160 can be formed using one or more deposition processes, including at least an initial selective epitaxial deposition process, such that the resulting extrinsic base layer 160 comprises a monocrystalline extrinsic base section 161 and a polycrystalline extrinsic base section 162 positioned laterally immediately adjacent to the monocrystalline extrinsic base section (212). During the deposition process(es) 212 and, particularly, during the initial selective epitaxial deposition process, monocrystalline semiconductor material for the monocrystalline extrinsic base section of the extrinsic base layer can be grown from the exposed first edge portion 133 of the monocrystalline intrinsic base section 131 of the intrinsic base layer 130. This selective epitaxial deposition process can further be performed to intentionally overgrow the monocrystalline semiconductor material until it extends laterally onto and essentially covers the dielectric landing pad 141.

Figure 6:
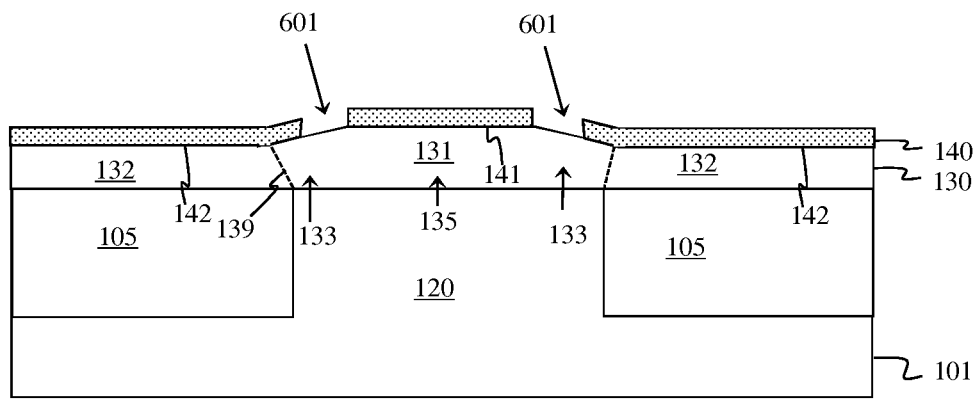
FIG. 6 is a cross-section diagram illustrating a partially completed bipolar device formed according to the flow diagram of FIG. 2.

It should be noted that depending upon the bipolar device being formed (i.e., depending upon whether the bipolar device 100A of FIG. 1A or the bipolar device 100B of FIG. 1B is being formed), the processes 209 and 212 can vary. Specifically, as illustrated in FIG. 6, if the bipolar device 100A is being formed, an opening 601 can be formed in the dielectric layer(s) 140 so as to only expose the first edge portion 133 of that monocrystalline intrinsic base section 131, thereby creating a dielectric landing pad 141 on the first center portion 135 of the monocrystalline intrinsic base section 131 of the intrinsic base layer 130 and also leaving an additional portion 142 of the dielectric layer(s) 140 remaining intact on the polycrystalline intrinsic base section 132 of the intrinsic base layer 130 (210). Alternatively, as illustrated in FIG. 7, if the bipolar device 100B of FIG. 1B is being formed, an opening 701 can be formed in the dielectric layer(s) 140 so as to expose the first edge portion 133 of the monocrystalline intrinsic base section 131 as well as the polycrystalline intrinsic base section 132 of the intrinsic base layer 130, thereby creating a dielectric landing pad 141 on the first center portion 135 of the monocrystalline intrinsic base section 131 of the intrinsic base layer 130 (i.e., so that only the dielectric landing pad 141 remains on the intrinsic base layer 130) (211).

Figure 8:
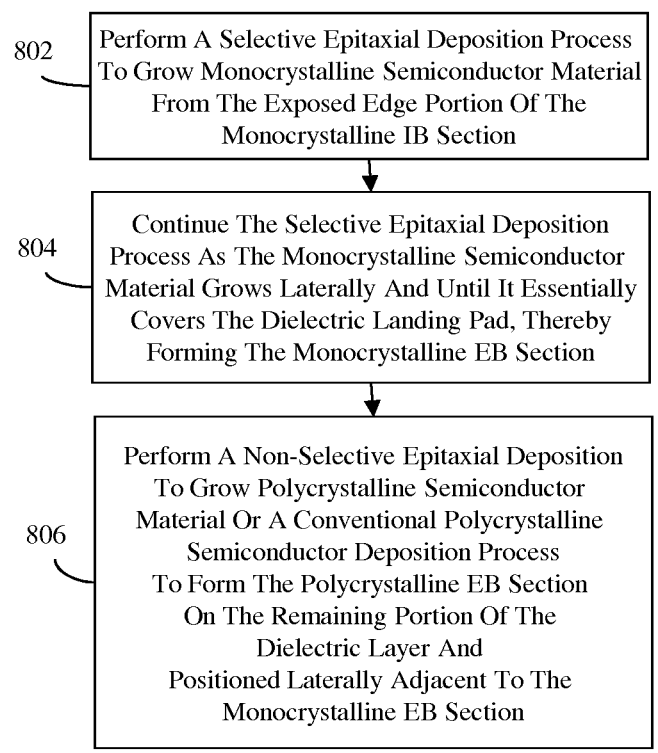
FIG. 8 is a flow diagram further detailing exemplary deposition processes that can be used at process step 212 of FIG. 2 in order to form the bipolar device of FIG. 1A.
Figure 9:
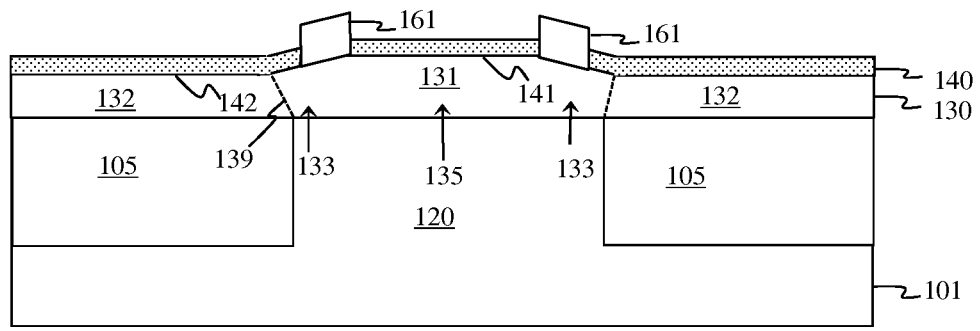
FIG. 9 is a cross-section diagram illustrating a partially completed bipolar device formed according to the flow diagram of FIG. 8.
Figure 10:
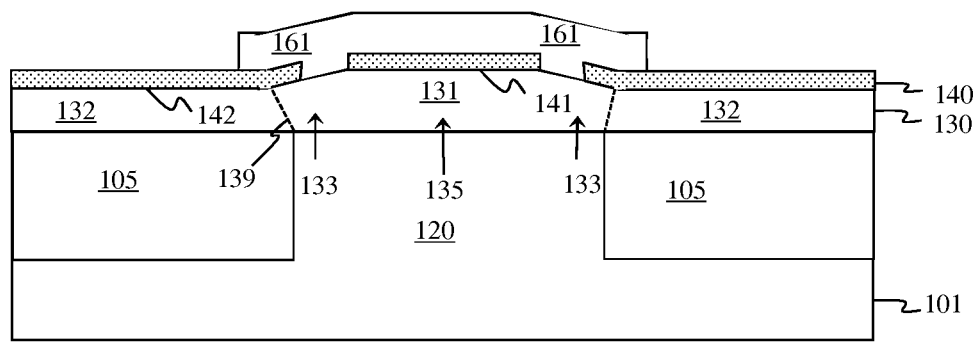
FIG. 10 is a cross-section diagram illustrating a partially completed bipolar device formed according to the flow diagram of FIG. 8.
Figure 11:
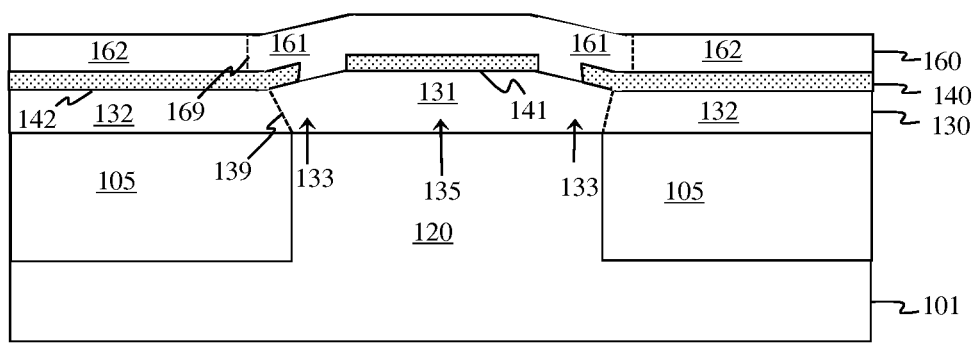
FIG. 11 is a cross-section diagram illustrating a partially completed bipolar device formed according to the flow diagram of FIG. 8.

FIG. 8 is a flow diagram illustrating in greater detail the epitaxial deposition processes 212 used to form the extrinsic base layer 160 on the structure shown in FIG. 6 (i.e., when the opening 601 is aligned above and exposes only the first edge portion 133 of the monocrystalline intrinsic base section 131 of the intrinsic base layer 130 such that a dielectric landing pad 141 is formed on the first center portion 135 of the monocrystalline intrinsic base section 131 and an additional portion 142 of the dielectric layer(s) 140 remains intact on the polycrystalline intrinsic base section 132 of the intrinsic base layer 130. In this case, the extrinsic base layer 160 can be formed by initially performing a selective epitaxial deposition process that grows monocrystalline semiconductor material for the monocrystalline extrinsic base section 161 of the extrinsic base layer on the exposed first edge portion 133 of the monocrystalline intrinsic base section 131 of the intrinsic base layer 130 (802, see FIG. 9). This selective epitaxial deposition process can be continued as the monocrystalline semiconductor material for the monocrystalline extrinsic base section 161 grows laterally in one direction onto the additional portion 142 of the dielectric layer 140 remaining above the polycrystalline intrinsic base section 132 of the intrinsic base layer 130 and in the opposite direction onto the dielectric landing pad 141 (804, see FIG. 10). This selective epitaxial deposition process can further be continued at process 804 until the monocrystalline semiconductor material for the monocrystalline extrinsic base section 161 of the extrinsic base layer 160 essentially covers the dielectric landing pad 141. For illustration purposes, the dielectric landing pad 141 is shown in FIG. 10 as being completely covered by monocrystalline semiconductor material, thereby indicating that the selective epitaxial deposition process continues until the laterally growing semiconductor material meets above the center of the dielectric landing pad 141. However, optionally, this selective epitaxial deposition process may stop prior to this point as long as the remaining space is smaller than the additional opening that will subsequently be formed at process 214 of FIG. 2, as discussed in detail below. Once the dielectric landing pad 141 is essentially covered with monocrystalline semiconductor material (i.e., once the monocrystalline extrinsic base section 161 of the extrinsic base layer 160 is completely formed), the polycrystalline extrinsic base section 162 of the extrinsic base layer 160 can be formed on the additional portion 142 of the dielectric layer(s) 140 positioned laterally adjacent to the monocrystalline extrinsic base section 161 by performing either a non-selective epitaxial deposition process to grow polycrystalline semiconductor material or, alternatively by performing a conventional polycrystalline semiconductor deposition process (e.g., by a low pressure chemical vapor deposition (LPCVD) process) (906, see FIG. 11). In this case, the interface 169 within the extrinsic base layer 160 between the monocrystalline extrinsic base section 161 and the polycrystalline extrinsic base section 162 will be above the additional portion 142 of the dielectric layer(s) 140 above the polycrystalline intrinsic base section 132 of the intrinsic base layer 130.

Figure 7:
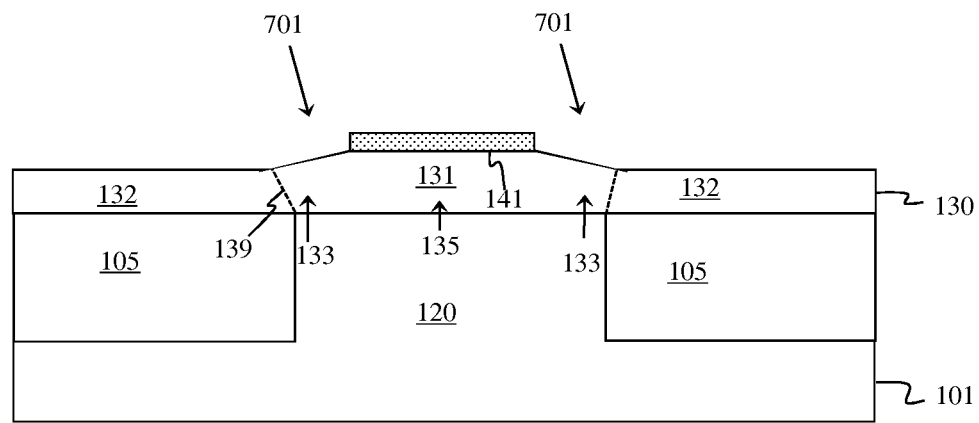
FIG. 7 is a cross-section diagram illustrating a partially completed bipolar device formed according to the flow diagram of FIG. 2.
Figure 12:
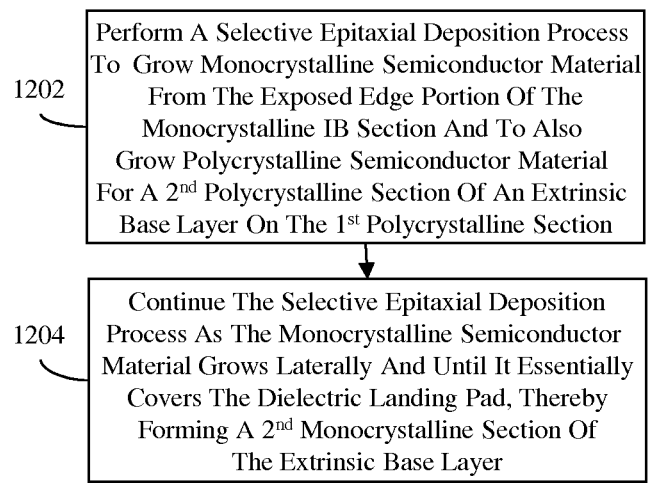
FIG. 12 is a flow diagram further detailing an exemplary deposition process that can be used at process step 212 of FIG. 2 in order to form the bipolar device of FIG. 1B.
Figure 13:
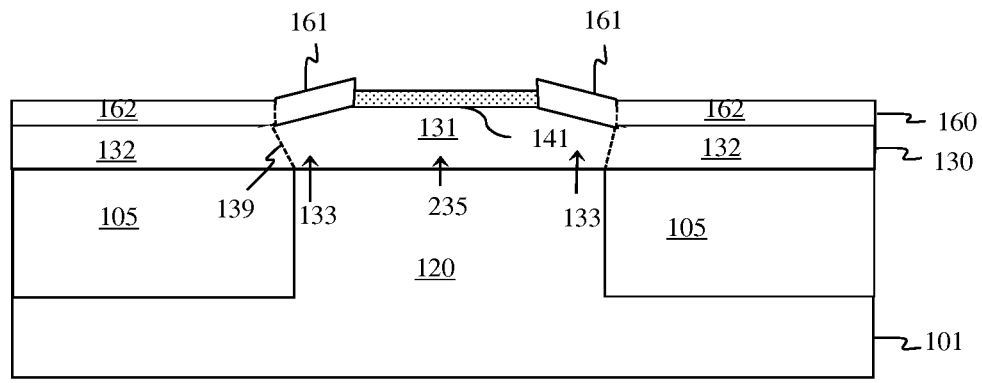
FIG. 13 is a cross-section diagram illustrating a partially completed bipolar device formed according to the flow diagram of FIG. 12.
Figure 14:
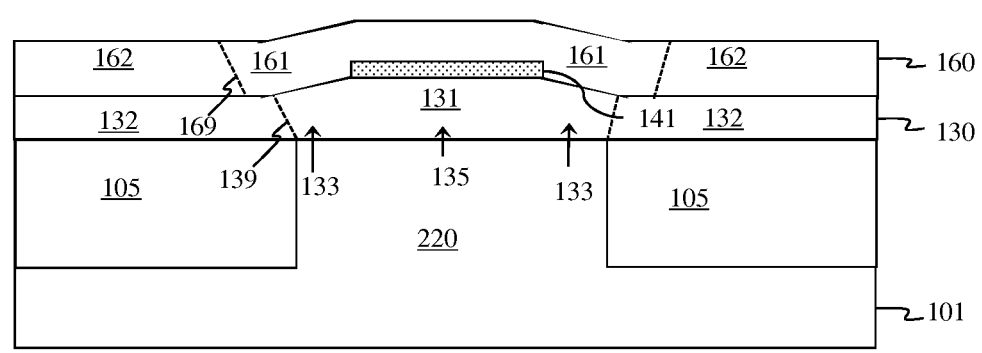
FIG. 14 is a cross-section diagram illustrating a partially completed bipolar device formed according to the flow diagram of FIG. 12.

FIG. 12 is a flow diagram illustrating in greater detail the epitaxial deposition processes 212 used to form an extrinsic base layer 160 on the structure shown in FIG. 7 (i.e., when the opening 701 is aligned above and exposes both the first edge portion 133 of the monocrystalline intrinsic base section 131 of the intrinsic base layer 130 and the polycrystalline intrinsic base section 132 of the intrinsic base layer 130 such that the only portion of the dielectric layer(s) 140 remaining on the intrinsic base layer 130 is the dielectric landing pad 141 above the first center portion 135 on the monocrystalline intrinsic base section 131). In this case, the extrinsic base layer 160 can be formed by performing a single epitaxial deposition process and, particularly, a single selective epitaxial deposition process. This selective epitaxial deposition process can initially grow monocrystalline semiconductor material for the monocrystalline extrinsic base section 161 of the extrinsic base layer 160 on the exposed first edge portion 133 of the monocrystalline intrinsic base section 131 of the intrinsic base layer 130 and can essentially simultaneously grow polycrystalline semiconductor material for the polycrystalline extrinsic base section 162 of the extrinsic base layer 160 on the exposed polycrystalline intrinsic base section 132 of the intrinsic base layer 130 (1202, see FIG. 13). This selective epitaxial deposition process can be continued as the monocrystalline semiconductor material grows laterally in one direction onto the polycrystalline intrinsic base section 132 of the intrinsic base layer 130 (i.e., over the first interface 139 in the intrinsic base layer 130 between the monocrystalline intrinsic base section 131 and the polycrystalline intrinsic base section 132) and in the opposite direction onto the dielectric landing pad 141 (1204, see FIG. 14). This selective epitaxial deposition process can be performed at process 1204 until the monocrystalline semiconductor material for the monocrystalline extrinsic base section 161 of the extrinsic base layer 160 essentially covers the dielectric landing pad 141. As a result, in this case, the second interface 169 within the extrinsic base layer 160 between the monocrystalline extrinsic base section 161 and the polycrystalline extrinsic base section 162 will be above the polycrystalline intrinsic base section 132 of the intrinsic base layer 130 (i.e., offset from the first interface 139 within the intrinsic base layer 130 between the monocrystalline intrinsic base section 131 and the polycrystalline intrinsic base section 132). For illustration purposes, the dielectric landing pad 141 is shown in FIG. 14 as being completely covered by monocrystalline semiconductor material, thereby indicating that the selective epitaxial deposition process continues until the laterally growing semiconductor material meets above the center of the dielectric landing pad 141. However, optionally, this selective epitaxial deposition process may stop prior to this point as long as the remaining space is smaller than the additional opening that will subsequently be formed at process 214 of FIG. 2, as discussed in detail below It should be noted that, in the case of either a BJT or an HBT, the extrinsic base layer 160 can comprise epitaxial silicon, silicon germanium, silicon carbide, silicon germanium carbide or a combination of two more of these materials. The extrinsic base layer 160 can further be in-situ doped or subsequently implanted so as to have the first type conductivity (e.g., P-type conductivity). Furthermore, the concentration of first type conductivity dopant (e.g., P-type dopant) in the extrinsic base layer 160 can, optionally, be relatively high as compared to the concentration of the same type conductivity dopant in the intrinsic base layer 130 and/or the semiconductor substrate 101.

Referring again to FIG. 2, after the extrinsic base layer 160 is formed at process 212, additional processes 214-220 can be performed in order to complete the bipolar device 100A of FIG. 1A or 100B of FIG. 1B. For illustration purposes, the processes 214-220 will be described below and illustrated with respect to forming the bipolar device 100A of FIG. 1A.

However, it should be understood that these exact same processes can be performed with respect to forming the bipolar device 100B of FIG. 1B.

Figure 15:
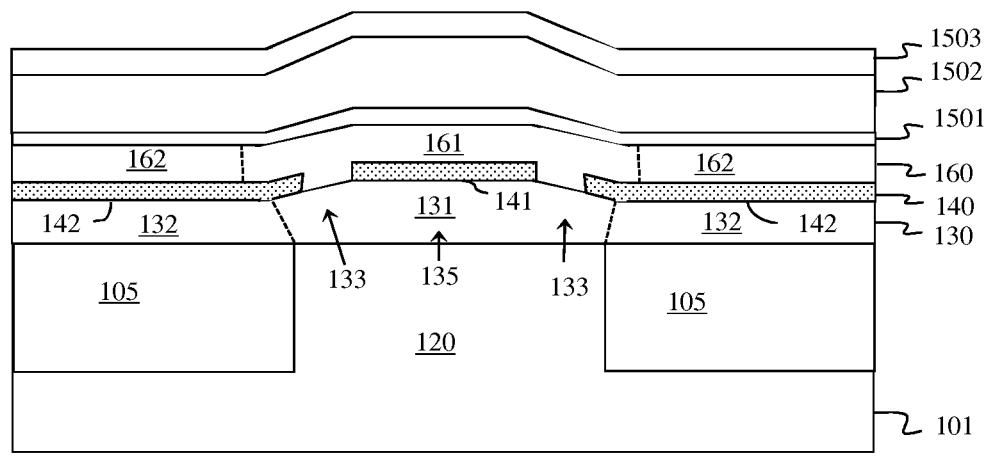
FIG. 15 is a cross-section diagram illustrating a partially completed bipolar device formed according to the flow diagram of FIG. 2.
Figure 16:
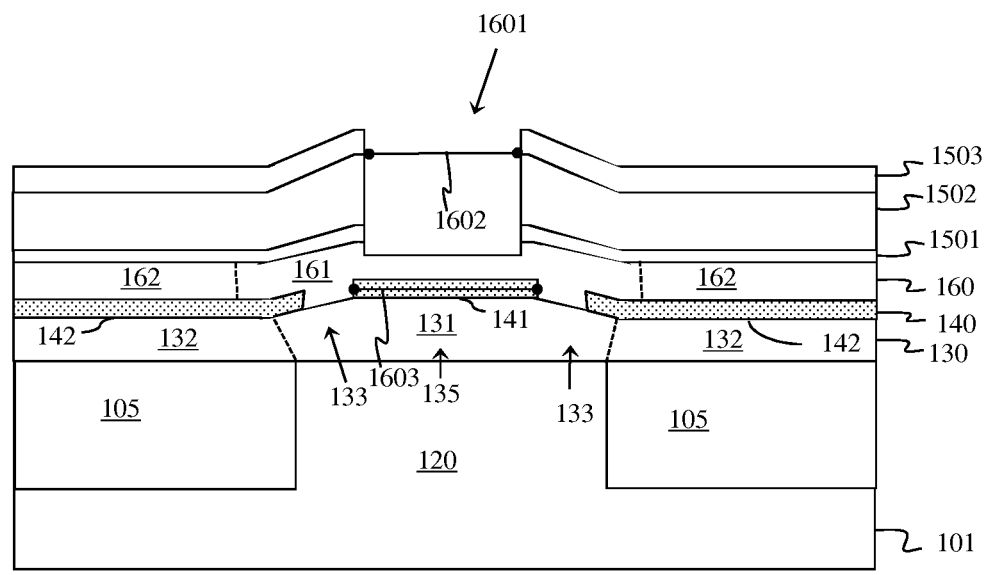
FIG. 16 is a cross-section diagram illustrating a partially completed bipolar device formed according to the flow diagram of FIG. 2.
Figure 17:
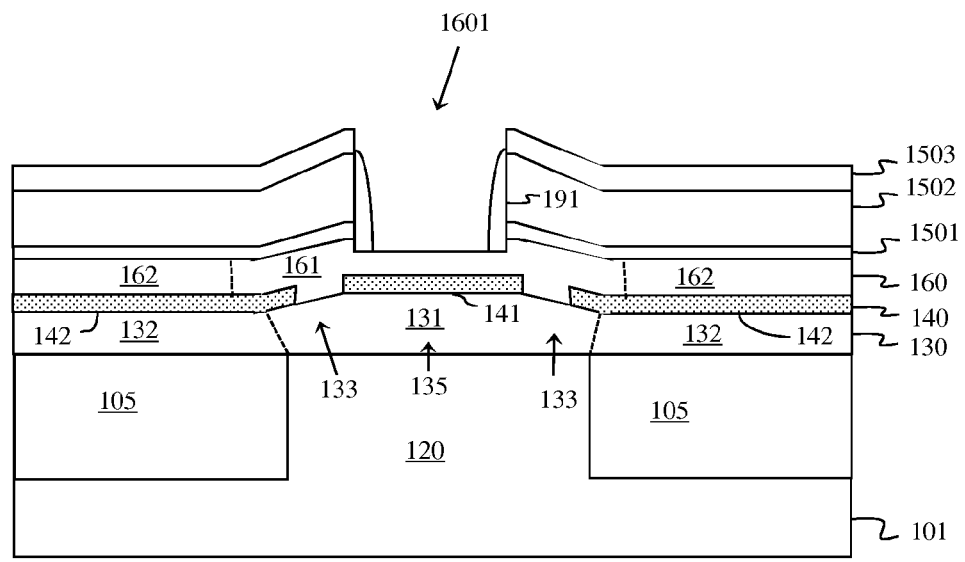
FIG. 17 is a cross-section diagram illustrating a partially completed bipolar device formed according to the flow diagram of FIG. 2.
Figure 18:
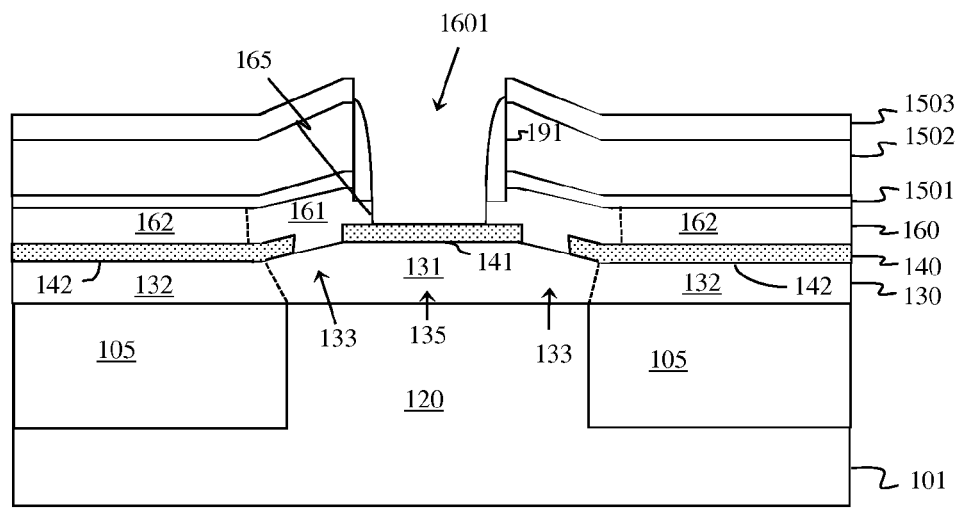
FIG. 18 is a cross-section diagram illustrating a partially completed bipolar device formed according to the flow diagram of FIG. 2.

At process 214, an additional opening 1601 (i.e., an emitter opening) can be formed through extrinsic base layer 160 to the dielectric landing pad 141. To accomplish this, one or more additional dielectric layers can be formed (e.g., deposited) on the extrinsic base layer 160 (see FIG. 15). For example, a first dielectric layer 1501 (e.g., a silicon oxide (SiO$_x$) layer) can be formed immediately adjacent to the extrinsic base layer 160, a second dielectric layer 1502 (e.g., a silicon nitride (SiN$_x$) layer) can be formed on the first dielectric layer 1501 and a third dielectric layer 1503 (e.g., another silicon oxide (SiO$_x$) layer) can be formed on the second dielectric layer 1502. Next, an upper portion of the additional opening 1601 can be formed (e.g., lithographically patterned and etched) such that it extends vertically through the dielectric layers 1501-1503 and into, but not through, the extrinsic base layer 160 (see FIG. 16). This upper portion of the additional opening 1601 can have width 1602 that is narrower than the width 1603 of the dielectric landing pad 141 and wider than any space remaining above the center of the dielectric landing pad 141 when the monocrystalline semiconductor material is grown laterally thereon. Then, a first dielectric spacer 191 (e.g., a silicon nitride (SiN$_x$) spacer) can be formed, using conventional sidewall spacer formation techniques, on the sidewall of the upper portion of the additional opening 1601 (see FIG. 17). After this first dielectric spacer 191 is formed, the additional opening 1601 can be extended (i.e., further etched) through the extrinsic base layer 160 to expose the top surface of the dielectric landing pad 141 as well as an upper sidewall surface 165 of the monocrystalline extrinsic base section 161 of the extrinsic base layer 160 (see FIG. 18).

Figure 19:
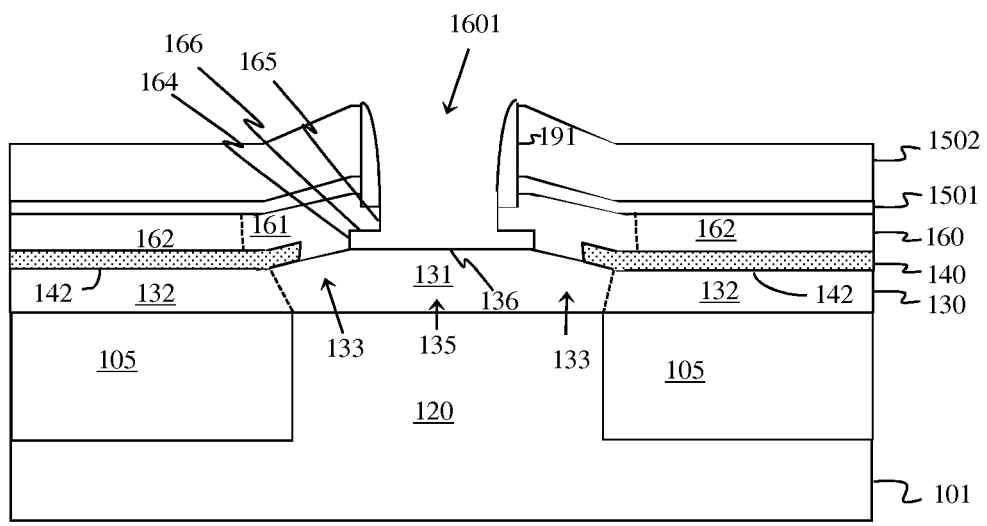
FIG. 19 is a cross-section diagram illustrating a partially completed bipolar device formed according to the flow diagram of FIG. 2.

At process 216, the dielectric landing pad 141 can be selectively removed (e.g., using a wet etch process) that also removes the third dielectric layer 1503 (e.g., the silicon oxide (SiO$_x$) layer) (see FIG. 19). Since the additional opening 1601 had a width 1602 that was less than the width 1603 of the dielectric landing pad 141, removal of the dielectric landing pad 141 will not only expose the top surface 136 of the first center portion 135 of the monocrystalline intrinsic base section 131 of the intrinsic base layer 130 but also a lower sidewall surface 164 of the monocrystalline extrinsic base section 161 of the extrinsic base layer 160, which is offset from the upper sidewall surface 165, and a bottom surface 166 of the monocrystalline extrinsic base section 161 of the extrinsic base layer 160, which extends laterally between the sidewall surfaces 164 and 165. Thus, etching of the additional opening 1601 at process 214 and removal of the dielectric landing pad 141 at process 216 exposes monocrystalline semiconductor surfaces only of the extrinsic base layer 160 (or, more particularly, the monocrystalline extrinsic base section 161) and the intrinsic base layer 130 (or, more particularly, the monocrystalline intrinsic base section 131).

Figure 20:
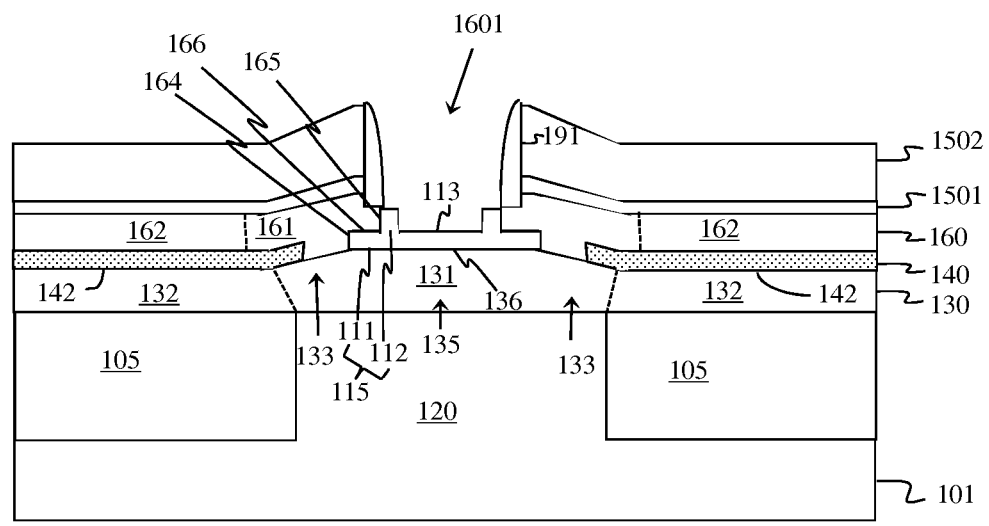
FIG. 20 is a cross-section diagram illustrating a partially completed bipolar device formed according to the flow diagram of FIG. 2.

Following removal of the dielectric landing pad 141 at process 216, a semiconductor layer 110 can be epitaxially deposited on the exposed monocrystalline semiconductor surfaces discussed above (218, see FIG. 20). Specifically, a non-selective epitaxial deposition process (e.g., a low temperature epitaxy (LTE) process) can be used to grow semiconductor material (e.g., silicon in the case of an BJT or silicon germanium, silicon germanium carbide or silicon carbide in the case of an HBT) on the exposed monocrystalline semiconductor surfaces and, particularly, on the top surface 136 of the first center portion 135 of the monocrystalline intrinsic base section 131 of the intrinsic base layer 130, on the lower sidewall surface 164 and the upper sidewall surface 165 of the monocrystalline extrinsic base section 161 of the extrinsic base layer 160 and on the bottom surface 166 of the monocrystalline extrinsic base section 161 of the extrinsic base layer 160, which extends laterally between the sidewall surfaces 164 and 165. Thus, the resulting semiconductor layer 110 will have a bottom surface that is immediately adjacent to the first center portion 135 only of the monocrystalline intrinsic base section 131 of the intrinsic base layer 130 and will further have a second center portion 113; a second edge portion 111, which is positioned laterally adjacent to the second center portion 113, which abuts the lower sidewall surface 164 of the monocrystalline extrinsic base section 161 of the extrinsic base layer 160 and which is stacked vertically between the top surface 136 of the monocrystalline intrinsic base section 131 of the intrinsic base layer 130 and the bottom surface 166 of the monocrystalline extrinsic base section 161 of the extrinsic base layer 160; and a vertical extension 112, which extends upward, which is offset from the second edge portion 111 (i.e., which is between the second center portion 113 and second edge portion 111) and which is positioned laterally immediately adjacent to the upper sidewall surface 165 of the monocrystalline extrinsic base section 161 of the extrinsic base layer 160.

Since the epitaxial semiconductor material for semiconductor layer 110 is grown on monocrystalline semiconductor surfaces only, the semiconductor layer 110 and, particularly, each of the portions 111, 112 and 113 of the semiconductor layer 110 will be entirely monocrystalline in structure. Thus, this technique ensures the formation of an entirely monocrystalline link-up region 115, which comprises the second edge portion 111 and the vertical extension 112 of the semiconductor layer 110 and which electrically connects the monocrystalline intrinsic base section 131 of the intrinsic base layer 130 and the monocrystalline extrinsic base section 161 of the extrinsic base layer 160. Furthermore, this technique ensures that the interfaces within the semiconductor layer 110 between the monocrystalline semiconductor material grown on the different semiconductor surfaces and, particularly, grown on opposing top and bottom monocrystalline semiconductor surfaces of the intrinsic base layer 130 and extrinsic base layer 160, respectively, will be uniform, thereby minimizing the occurrence of voids within the semiconductor layer 110 and, particularly, within the link-up region 115 that could increase resistance. Such a monocrystalline link-up region 115 provides a reduction in overall base resistance $R_b$ within the bipolar device and, thereby a higher $f_{max}$.

Optionally, deposition of the semiconductor layer 110 at process 218 can proceed without doping to alter the conductivity type. Alternatively, the semiconductor layer 110 can be in-situ doped at process 218 or subsequently implanted with a dopant so as to have the first type conductivity (e.g., P-type conductivity) at the same or different conductivity levels than the semiconductor substrate 101, the intrinsic base layer 130, and/or the extrinsic base layer 160.

It should be noted that in the process steps described above and illustrated in FIG. 2, the intrinsic base layer 130, the extrinsic base layer 160, and the semiconductor layer 110 can each be formed so as to comprise the same semiconductor material (e.g., silicon, silicon germanium, silicon carbide or silicon germanium carbide). Alternatively, any two or more of the layers 130, 160 and 110 may be formed so as to comprise different semiconductor materials (e.g., silicon and silicon germanium, silicon carbide or silicon germanium carbide; silicon germanium and silicon carbide or silicon germanium carbide, etc.). Furthermore, any one or more of the layers 130, 160 and 110 may be undoped or doped so as to have the same conductivity type at a different conductivity level than the other layers.

In order to complete the bipolar device 100A of FIG. 1A or 100B of FIG. 1B at process 220 additional structural features can be formed. These additional structural features can include, but are not limited to, an emitter layer 180; dielectric spacer(s) 192-193; metal silicide layer(s) 170; interlayer dielectric(s) 195; contacts 196; etc.

Figure 21:
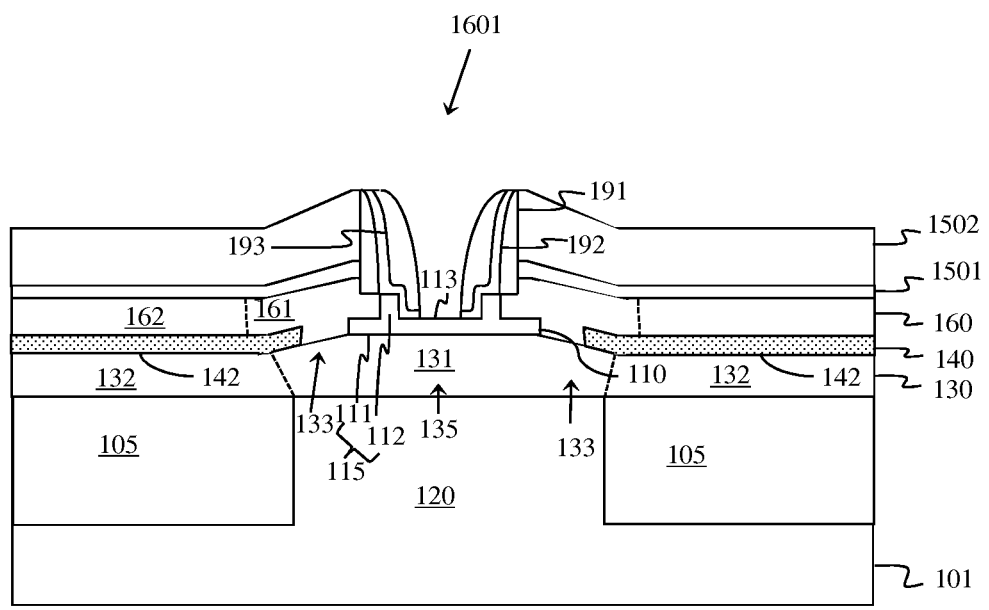
FIG. 21 is a cross-section diagram illustrating a partially completed bipolar device formed according to the flow diagram of FIG. 2.
Figure 22:
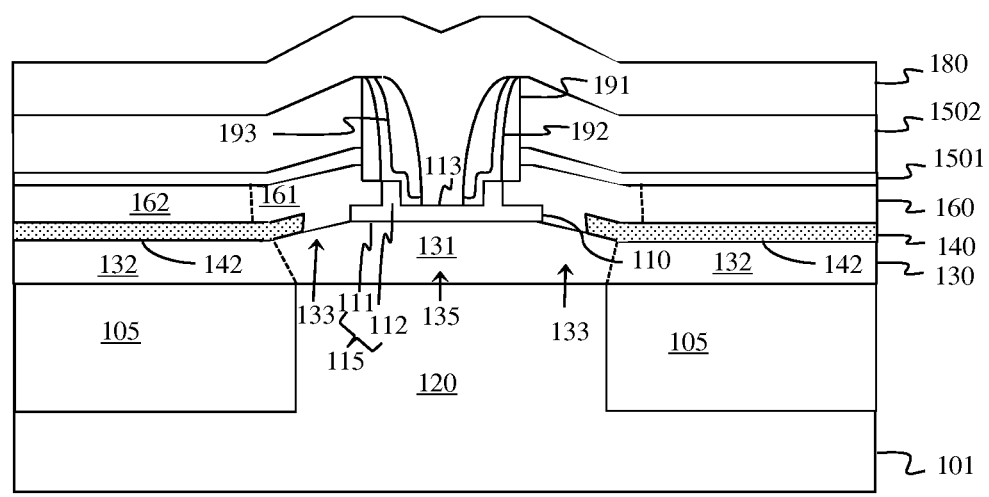
FIG. 22 is a cross-section diagram illustrating a partially completed bipolar device formed according to the flow diagram of FIG. 2.

For example, to form such features, a conformal dielectric layer (e.g., a silicon oxide ($SiO_x$) layer) can be deposited so as to line the additional opening 1601 above the semiconductor layer 110 and yet another dielectric layer (e.g., a silicon nitride ($SiN_x$) layer) can be deposited on the conformal dielectric layer. Then, etch processes can be performed so as to expose the second center portion 113 of the semiconductor layer 110, thereby creating a second dielectric spacer 192 and a third dielectric spacer 193 (see FIG. 21). The second dielectric spacer 192 (e.g., a silicon oxide ($SiO_x$) spacer) can be positioned laterally adjacent to the first spacer 191 and can further cover the top surface of the semiconductor layer vertical extension 112 as well as the sidewall of the vertical extension 112 opposite the upper sidewall surface 165 of the monocrystalline extrinsic base section 161 of the extrinsic base layer 160. The third dielectric spacer 193 (e.g., a silicon nitride ($SiN_x$) spacer) can be positioned laterally adjacent to the second dielectric spacer 192. Next, an emitter layer 180 can be deposited so as to fill the additional opening 1601 (see FIG. 22). The emitter layer 180 can comprise, for example, a polycrystalline semiconductor layer (e.g., a polycrystalline silicon layer) that is in-situ doped or subsequently implanted with a dopant so as to have the same second type conductivity as the collector region 120 (e.g., N-type conductivity).

Next, conventional processing techniques can be used to pattern and etch the emitter layer 180 to create the conventional T-shape, to form optional metal silicide layer(s) 170 on the top surfaces of the extrinsic base layer 160 and emitter layer 180, to cover the bipolar device with one or more interlayer dielectric(s) 195, to form contacts 196 to the extrinsic base layer 160 and emitter layer 180, etc. (see FIG. 1A or 1B). Various different techniques for forming these features are well known in the art and, thus, are omitted from this specification in order to allow the reader to focus on the salient aspects of the method embodiments. However, it should be understood that any of these various techniques could be incorporated into the different methods disclosed.

It should be noted that in the structure and method embodiments described above, the first type conductivity is referred to as being P-type conductivity and the second type conductivity is referred to as being N-type conductivity. However, alternatively, the reverse can be true. That is, the first type conductivity can comprise N-type conductivity and the second type conductivity can comprise P-type conductivity. Those skilled in the art will recognize that different dopants can be used to achieve the different conductivity types and that the dopants may vary depending upon the different semiconductor materials used. For example, a silicon-based semiconductor material having N-type conductivity is typically doped with an N-type dopant (e.g., a Group V dopant, such as arsenic (As), phosphorous (P) or antimony (Sb)), whereas a silicon-based semiconductor material having P-type conductivity is typically doped with a P-type dopant (e.g., a Group III dopant, such as boron (B) or indium (In)). Alternatively, a gallium nitride (GaN)-based semiconductor material having P-type conductivity is typically doped with magnesium (Mg), whereas a gallium nitride (GaN)-based semiconductor material having an N-type conductivity is typically doped with silicon (Si). Those skilled in the art will also recognize that different conductivity levels of the different bipolar device components will depend upon the relative concentration levels of the dopants.

It should be understood that the terminology used herein is for the purpose of describing particular embodiments only and is not intended to be limiting. As used herein, the singular forms "a", "an" and "the" are intended to include the plural forms as well, unless the context clearly indicates otherwise. It should further be understood that the terms "comprises" "comprising", "includes" and/or "including", as used in this specification, specify the presence of stated features, integers, steps, operations, elements, and/or components, but do not preclude the presence or addition of one or more other features, integers, steps, operations, elements, components, and/or groups thereof. Additionally, it should be understood that the corresponding structures, materials, acts, and equivalents of all means or step plus function elements in the claims below are intended to include any structure, material, or act for performing the function in combination with other claimed elements as specifically claimed.

Therefore, disclosed above are bipolar devices, such as bipolar junction transistors (BJTs) or heterojunction bipolar transistors (HBTs), which incorporate a link-up region that is entirely monocrystalline in structure and that electrically connects a monocrystalline section of an intrinsic base layer to a monocrystalline section of an extrinsic base layer for a reduction in overall base resistance $R_b$ for a higher $f_{max}$. Also disclosed herein are methods of forming these bipolar devices. In the methods, an extrinsic base layer can be formed above an intrinsic base layer using a selective epitaxial deposition process. Specifically, this selective epitaxial deposition process can grow monocrystalline semiconductor material for the extrinsic base layer on an exposed edge portion of a monocrystalline section of the intrinsic base layer and can further be performed until the monocrystalline semiconductor material essentially covers a dielectric landing pad on a center portion of that same monocrystalline section of the intrinsic base layer. Subsequently, an opening can be formed through the extrinsic base layer to the dielectric landing pad and the dielectric landing pad can be selectively removed, thereby exposing monocrystalline surfaces only of the intrinsic and extrinsic base layers. Then, a semiconductor layer can be formed by epitaxial deposition on the exposed monocrystalline surfaces, thereby forming a link-up region between the intrinsic and extrinsic base layers that is entirely monocrystalline in structure.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:
1. A bipolar device comprising:
   an intrinsic base layer comprising:
      a monocrystalline intrinsic base section having a first center portion and a first edge portion positioned laterally adjacent to said first center; and
      a polycrystalline intrinsic base section positioned laterally adjacent to said first edge portion;

a dielectric layer on said polycrystalline intrinsic base section;

a semiconductor layer on said first center portion of said monocrystalline intrinsic base section and having a second center portion, a second edge portion positioned laterally adjacent to said second center portion and a vertical extension offset from said second edge portion; and an extrinsic base layer comprising:
   a polycrystalline extrinsic base section on said dielectric layer; and
   a monocrystalline extrinsic base section on said first edge portion of said monocrystalline intrinsic base section, extending laterally over said dielectric layer to said polycrystalline extrinsic base section and further extending laterally over said second edge portion of said semiconductor layer to said vertical extension,
said semiconductor layer being entirely monocrystalline in structure such that that said second edge portion and said vertical extension of said semiconductor layer comprise an entirely monocrystalline link-up region between said intrinsic base layer and said extrinsic base layer.

2. The bipolar device of claim 1, said intrinsic base layer, said extrinsic base layer, and said semiconductor layer comprising a same semiconductor material.

3. The bipolar device of claim 1, wherein at least two of said intrinsic base layer, said extrinsic base layer, and said semiconductor layer comprising different semiconductor materials.

4. The bipolar device of claim 1, said intrinsic base layer comprising silicon germanium.

5. The bipolar device of claim 1, said dielectric layer comprising an oxide.

6. The bipolar device of claim 1, further comprising:
a substrate comprising a collector region and a trench isolation region positioned laterally adjacent to said collector region, said intrinsic base layer being on said substrate with said monocrystalline intrinsic base section aligned above said collector region and said polycrystalline intrinsic base section aligned above said trench isolation region; and
an emitter layer on said second center portion of said semiconductor layer.

7. A bipolar device comprising:
an intrinsic base layer comprising:
   a monocrystalline intrinsic base section having a first center portion and a first edge portion positioned laterally adjacent to said first edge portion; and
   a polycrystalline intrinsic base section positioned laterally adjacent to said first edge portion;

a semiconductor layer on said first center portion of said monocrystalline intrinsic base section and having a second center portion, a second edge portion positioned laterally adjacent to said second center portion and a vertical extension offset from said second edge portion; and an extrinsic base layer comprising:
   a polycrystalline extrinsic base section on said polycrystalline intrinsic base section; and
   a monocrystalline extrinsic base section on said first edge portion of said monocrystalline intrinsic base section, extending laterally over said polycrystalline intrinsic base section to said polycrystalline extrinsic base section and further extending laterally over said second edge portion of said semiconductor layer to said vertical extension,
said semiconductor layer being entirely monocrystalline in structure such that that said second edge portion and said vertical extension of said semiconductor layer comprise an entirely monocrystalline link-up region between said intrinsic base layer and said extrinsic base layer.

8. The bipolar device of claim 7, said intrinsic base layer, said extrinsic base layer, and said semiconductor layer comprising a same semiconductor material.

9. The bipolar device of claim 7, wherein at least two of said intrinsic base layer, said extrinsic base layer, and said semiconductor layer comprising different semiconductor materials.

10. The bipolar device of claim 7, said intrinsic base layer comprising a silicon germanium.

11. The bipolar device of claim 7, wherein at least two of said intrinsic base layer, said extrinsic base layer, and said semiconductor layer comprising different semiconductor materials.

12. The bipolar device of claim 7, further comprising:
a substrate comprising a collector region and a trench isolation region positioned laterally adjacent to said collector region, said intrinsic base layer being on said substrate with said monocrystalline intrinsic base section aligned above said collector region and said polycrystalline intrinsic base section aligned above said trench isolation region; and
an emitter layer on said second center portion of said semiconductor layer.

* * * * *